US012627907B2

(12) United States Patent
Kwon

(10) Patent No.: US 12,627,907 B2
(45) Date of Patent: May 12, 2026

(54) IMAGE SENSING DEVICE AND IMAGING DEVICE INCLUDING THE SAME

(71) Applicant: SK hynix Inc., Icheon-si (KR)

(72) Inventor: Hyo Jun Kwon, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 71 days.

(21) Appl. No.: 18/829,966

(22) Filed: Sep. 10, 2024

(65) Prior Publication Data

US 2025/0373958 A1 Dec. 4, 2025

(30) Foreign Application Priority Data

May 31, 2024 (KR) ......................... 10-2024-0071449

(51) Int. Cl.
H04N 25/772 (2023.01)
H10F 39/00 (2025.01)

(52) U.S. Cl.
CPC ....... H04N 25/772 (2023.01); H10F 39/8037 (2025.01); H10F 39/811 (2025.01)

(58) Field of Classification Search
CPC .. H04N 25/772; H10F 39/8037; H10F 39/811
See application file for complete search history.

(56) References Cited

U.S. PATENT DOCUMENTS

| | | | | |
|---|---|---|---|---|
| 9,565,375 B1 * | 2/2017 | Raynor | .................. | H10F 39/199 |
| 10,791,292 B1 * | 9/2020 | Geurts | ................. | H04N 25/771 |
| 11,418,734 B1 * | 8/2022 | Wang | ...................... | H04N 25/78 |
| 2020/0013785 A1 * | 1/2020 | Frank | .................... | H10D 64/033 |
| 2020/0260025 A1 * | 8/2020 | Seo | ......................... | H04N 25/59 |
| 2022/0353449 A1 * | 11/2022 | Ito | ........................... | H10F 39/811 |
| 2022/0367558 A1 * | 11/2022 | Fujii | ..................... | H10F 39/024 |
| 2022/0392702 A1 | 12/2022 | Lim et al. | | |

FOREIGN PATENT DOCUMENTS

| | | | |
|---|---|---|---|
| KR | 20220030802 A | 3/2022 | |

* cited by examiner

*Primary Examiner* — Chiawei Chen

(74) *Attorney, Agent, or Firm* — Perkins Coie LLP

(57) ABSTRACT

An imaging device comprises a pixel including a photoelectric conversion device for generating pixel signals, a floating diffusion region, a first dual conversion gain (DCG) transistor for providing additional capacitance to the floating diffusion region, and a first DCG capacitor connected to the floating diffusion region through the first DCG transistor; and an analog-digital converter (ADC) for converting the pixel signals into image data, wherein the pixel includes a first metal layer including a first DCG gate electrode of the first DCG transistor and a first electrode of the first DCG capacitor, a second metal layer including a dual conversion line that supplies a first DCG gate signal to the first DCG gate electrode, and a second electrode overlapping the first electrode, a first insulating layer between the first DCG gate electrode and the dual conversion line, and a second insulating layer between the first electrode and the second electrode.

20 Claims, 24 Drawing Sheets

IMAGE SENSING DEVICE AND IMAGING DEVICE INCLUDING THE SAME

CROSS REFERENCE TO RELATED APPLICATION

This patent document claims priority to Korean Patent Application No. 10-2024-0071449, filed May 31, 2024, the entire contents of which is incorporated herein for all purposes by this reference.

TECHNICAL FIELD

The disclosed technology relates to an image sensing device and an imaging device including the same.

BACKGROUND

With the advancement in the information and communication industry and digitalization of electronic devices, image sensors with improved performance are used in various fields such as digital cameras, camcorders, cellular phones, personal communication systems (PCSs), gaming devices, security cameras, medical micro cameras, and the like. Generally, an image sensor has a pixel area including a photodiode and a peripheral circuit region. A unit pixel includes a photodiode and a transfer transistor. The transfer transistor is arranged between the photodiode and the floating diffusion region and transfers charges generated by the photodiode to the floating diffusion region.

SUMMARY

Some implementations of the disclosed technology provide an imaging device that can supply additional capacitance to a floating diffusion region.

Some implementations of the disclosed technology provide an imaging device that can increase capacitance of a Dual Conversion Gain (DCG) capacitor.

Some implementations of the disclosed technology provide an imaging device that may increase the conversion ratio of Conversion Gain (CG) by increasing capacitance of a DCG capacitor.

Some implementations of the disclosed technology provide an imaging device that can increase capacitance of a Dual Conversion Gain (DCG) capacitor in a shared structure of a floating diffusion region.

In one aspect of the present disclosure, there is provided an imaging device comprising: a pixel including a photo-electric conversion device for generating pixel signals each having a size corresponding to illuminance and generating photo charges corresponding to the illuminance, a floating diffusion region for accumulating the generated photo charges, a first dual conversion gain (DCG) transistor for providing additional capacitance to the floating diffusion region, and a first DCG capacitor connected to the floating diffusion region through the first DCG transistor; and an analog-digital converter (ADC) for converting the pixel signals into image data, wherein the pixel includes a first metal layer including a first DCG gate electrode of the first DCG transistor and a first electrode of the first DCG capacitor, a second metal layer including a dual conversion line that supplies a first DCG gate signal to the first DCG gate electrode on the first metal layer, and a second electrode overlapping the first electrode, a first insulating layer between the first DCG gate electrode and the dual conversion line, and a second insulating layer between the first electrode and the second electrode, wherein a permittivity of the second insulating layer is higher than a permittivity of the first insulating layer.

According to another aspect of the present disclosure, there is provided an imaging device comprising: a first metal layer including a floating diffusion electrode of a floating diffusion region that accumulates photo charges generated by a photoelectric conversion device, a gate electrode of a DCG transistor that provides additional capacitance to the floating diffusion region, and a first electrode of a first DCG capacitor connected to the source electrode of the DCG transistor and surrounding the floating diffusion electrode; a second metal layer arranged on the first metal layer and including a dual conversion line for supplying a DCG gate signal, and a second electrode of the first DCG capacitor overlapping the first electrode; a first insulating layer between the first DCG gate electrode and the dual conversion line; and a second insulating layer between the first electrode and the second electrode, wherein permittivity of the second insulating layer is higher than the permittivity of the first insulating layer.

Details of other embodiments are included in the detailed description and drawings.

DETAILED DESCRIPTION

Figure 1:
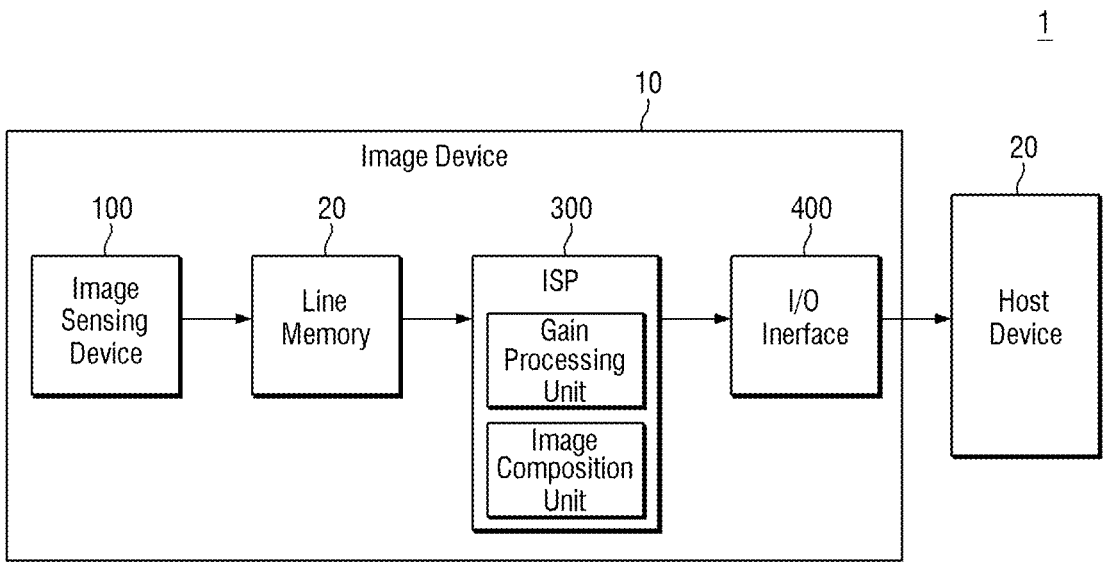
FIG. 1 is a block diagram showing an imaging system according to an embodiment of the disclosed technology.

Hereinafter, embodiments will be described with reference to the drawings. In this specification, when a component (or a region, a layer, a part, or the like) is mentioned as "on", "connected to", or "coupled to" another component, it means that the component may be directly connected/coupled on another component or a third component may be arranged therebetween.

Like reference numerals refer to like elements. In addition, in the drawings, the thickness, proportions, and dimensions of components are exaggerated for effective explanation of technical content. "And/or" includes all of one or more combinations that the associated configurations may define.

Terms such as first, second, and the like may be used to describe various components, but the components are not limited by the terms. The above terms are used only for the purpose of distinguishing one component from another. For example, a first component may be named a second component without departing from the scope of the present embodiments, and similarly, a second component may also be named a first component. Singular expressions include plural expressions unless the context clearly dictates otherwise.

Terms such as "below," "under", "above," "on", and the like are used to describe the relations between the components shown in the drawings. The above terms are relative concepts and explained based on the directions indicated in the drawings.

Terms such as "include", "have", and the like are intended to indicate the presence of features, numbers, steps, operations, components, parts, or combinations thereof described in the specification, and should be understood as not excluding in advance the presence or addition of one or more other features, numbers, steps, operations, components, parts, or combinations thereof.

Figure 2:
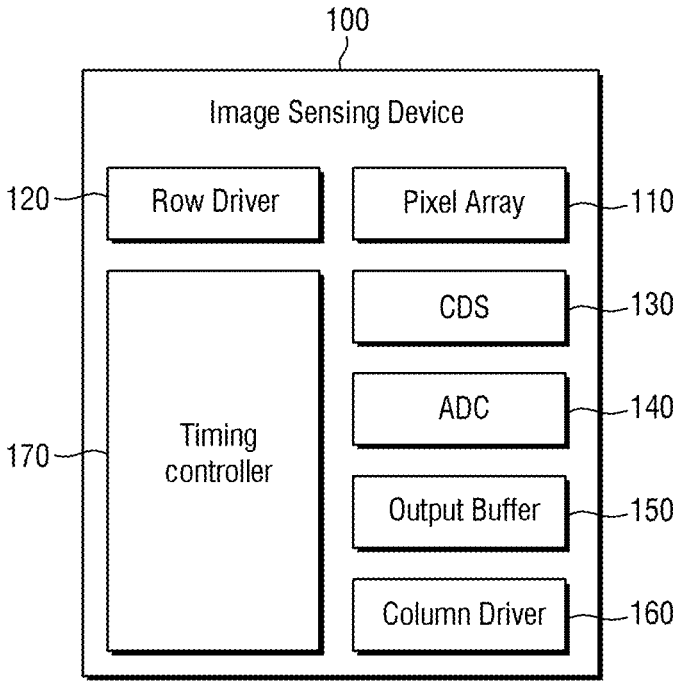
FIG. 2 is a block diagram showing the image sensing device shown in FIG. 1 in more detail.

FIG. 1 is a block diagram showing an imaging system according to an embodiment. FIG. 2 is a block diagram showing the image sensing device shown in FIG. 1 in more detail.

Referring to the example as shown in FIG. 1, an imaging system 1 may be provided as a device such as a digital still camera for capturing still images or a digital video camera for capturing videos. For example, the imaging device 10 may be implemented as a digital single lens reflex (DSLR) camera, a mirrorless camera, or a cellular phone (particularly, a smartphone). Those are the examples of the imaging device 10 and the imaging device is not limited thereto. The imaging device 10 may refer to a device capable of capturing subjects and generating images by including a lens and an image capturing device.

The imaging system 1 may include an imaging device 10 and a host device 20.

The imaging device 10 may include an image sensing device 100, a line memory 200, an image signal processor (ISP) 300, and an input/output (I/O) interface 400.

The image sensing device 100 may be a Complementary Metal Oxide Semiconductor Image Sensor (CIS) that converts optical signals into electrical signals. The overall operation of the image sensing device 100, such as on/off, operation mode, operation timing, sensitivity, and the like, may be controlled by the ISP 300. The image sensing device 100 may transmit image data obtained by converting optical signals into electrical signals to the line memory 200 under the control of the ISP 300.

Referring to FIG. 2, the image sensing device 100 may include a pixel array 110, a row driver 120, a Correlate Double Sampler (CDS) 130, an analog-to-digital converter (ADC) 140, an output buffer 150, a column driver 160, and a timing controller 170. Here, each component of the image sensing device 100 is merely an example, and at least some components may be added or omitted as needed.

The pixel array 110 may include a plurality of image pixels arranged in a plurality of rows and a plurality of columns. In an embodiment, the plurality of image pixels may be arranged in a two-dimensional pixel array including rows and columns. In another embodiment, the plurality of image pixels may be arranged in a three-dimensional pixel array. The plurality of image pixels may convert optical signals into electrical signals on a pixel basis or a pixel group basis, and image pixels in a pixel group may share at least a specific internal circuit. The pixel array 110 may receive a pixel control signal including a row selection signal, a pixel reset signal, a transfer signal, or the like from the row driver 120, and a corresponding pixel of the pixel array 110 may be activated by the pixel control signal to perform an operation corresponding to the row selection signal, pixel reset signal, transfer signal, or the like. Each of the image pixels may detect incident light by generating photo charges corresponding to the strength (or illuminance) of the incident light and generating an electrical signal of a size corresponding to the quantity of the generated photo charges. For convenience of explanation, the image pixels may also be referred to as pixels.

The row driver 120 may activate the pixel array 110 to perform specific operations on pixels included in a corresponding row on the basis of commands and control signals supplied by the timing controller 170. In an embodiment, the row driver 120 may select at least one pixel arranged in at least one row of the pixel array 110. The row driver 120 may generate a row selection signal to select at least one row among the plurality of rows. The row driver 120 may sequentially enable a pixel reset signal and a transfer signal for pixels corresponding to at least one selected row. Accordingly, a reference signal and an image signal of analog form generated from each of the pixels of the selected row may be sequentially transferred to the correlate double sampler 130. Here, the reference signal may be an electrical signal provided to the correlate double sampler 130 when a sensing node (e.g., floating diffusion region) of the pixel is reset, and the image signal may be an electrical signal provided to the correlate double sampler 130 when photo charges generated by the pixel are accumulated in the sensing node. The reference signal representing pixel-specific reset noise and the image signal representing strength of incident light may be commonly referred to as pixel signals.

The image sensing device 100 may use correlate double sampling to remove unwanted offset values of pixels, such as fixed pattern noise, by sampling the pixel signal twice to remove the difference between two samples. For example, the correlate double sampling removes unwanted offset values by comparing pixel output voltages acquired before and after the photo charges generated by the incident light are accumulated in the sensing node, so that a pixel output voltage based only on the incident light may be measured. In an embodiment, the correlate double sampler 130 may sequentially sample and hold the reference signal and the image signal provided from the pixel array 110 to each of a plurality of column lines. In some implementations, the correlate double sampler 130 may sample and hold the levels of the reference signal and the image signal corresponding to each of the columns of the pixel array 110.

The correlate double sampler 130 may transfer the reference signal and the image signal of each of the columns to the ADC 140 as a correlate double sampling signal on the basis of the control signal received from the timing controller 170.

The ADC 140 may convert the correlate double sampling signal for each column output from the correlate double sampler 130 into a digital signal, and output image data. In an embodiment, the ADC 140 may convert the correlate double sampling signal generated by the correlate double sampler 130 for each of the columns into a digital signal, and output the digital signal.

The ADC 140 may include a plurality of column counters corresponding to each of the columns of the pixel array 110. Each column of the pixel array 110 is connected to each column counter, and image data may be generated by converting a correlate double sampling signal corresponding to each of the columns into a digital signal using the column counters. According to another embodiment, the ADC 140 includes one global counter and may convert a correlate double sampling signal corresponding to each of the columns into a digital signal using a global code provided by the global counter.

The output buffer 150 may temporarily hold and output each image data of column units provided from the ADC 140. The output buffer 150 may temporarily store image data output from the ADC 140 on the basis of the control signal of the timing controller 170. The output buffer 150 may operate as an interface that compensates for the difference in the transmission speed (or processing speed) between different devices connected to the image sensing device 100.

The column driver 160 may select a column of the output buffer 150 on the basis of the control signal of the timing controller 170, and control the output buffer 150 to sequentially output the image data temporarily stored in the selected column. In an embodiment, the column driver 160 may receive an address signal from the timing controller 170, and the column driver 160 may select a column of the output buffer 150 by generating a column selection signal on the basis of the address signal, and control to output the image data from the selected column of the output buffer 150 to the outside.

The timing controller 170 may control at least one among the row driver 120, the correlate double sampler 130, the ADC 140, the output buffer 150, and the column driver 160.

The timing controller 170 may provide a clock signal required for the operation of each component of the image sensing device 100, a control signal for timing control, and an address signal for selecting a row or a column to at least one among the row driver 120, the correlate double sampler 130, the ADC 140, the output buffer 150, and the column driver 160. According to an embodiment, the timing controller 170 may include a logic control circuit, a phase lock loop (PLL) circuit, a timing control circuit, and a communication interface circuit.

Referring to FIG. 1 again, the line memory 200 may include volatile memory (e.g., DRAM, SRAM) and/or non-volatile memory (e.g., flash memory). The line memory 200 may have a capacitance capable of storing image data corresponding to a predetermined number of lines. Here, the line may mean a row of the pixel array 110, and the predetermined number may be a value smaller than the total number of rows of the pixel array 110. Accordingly, the line memory 200 may be a line memory capable of storing image data corresponding to some rows (or lines) of the pixel array 110, not a frame memory capable of storing image data corresponding to frames captured by the pixel array 110 at a time. According to another embodiment, the line memory 200 may be replaced with the frame memory.

The line memory 200 may receive and store image data from the image sensing device 100, and transmit the stored image data to the ISP 300 under the control of the ISP 300.

The ISP 300 may perform image signal processing on the image data stored in the line memory 200. The ISP 300 may reduce noise in the image data, and perform image signal processing for improving image quality, such as gamma correction, color filter array interpolation, color matrix, color correction, color enhancement, lens distortion correction, and the like. In addition, the ISP 300 may generate an image file by compressing the image data generated by performing the image signal processing for improving image quality, or may restore the image data from the image file. The compression format of the image may be a reversible format or a non-reversible format. As an example of the compression format, in the case of still images, the JPEG (Joint Photographic Experts Group) format or JPEG 2000 format may be used. In addition, in the case of a video, a video file may be generated by compressing a plurality of frames according to the Moving Picture Experts Group (MPEG) standard. The image file may be generated according to, for example, the Exchangeable image file format (Exif) standard.

To generate an HDR image, the ISP 300 may include a gain processing unit 310 and an image compositing unit 320.

The gain processing unit 310 may determine a gain that is used for processing the image data, e.g., a process for a multiplication operation on the image data. The gain processing unit 310 may determine a gain according to the conversion gain difference between the high conversion gain (HCG) mode and the low conversion gain (LCG) mode, and provide the gain to the image compositing unit 320. The gain according to the conversion gain difference may be experimentally determined in advance and stored in the gain processing unit 310. According to an embodiment, the gain processing unit 310 may store, in a table, the gains corresponding to the size of the image data, which are experimentally determined, and the gain processing unit 310 may acquire a gain corresponding to the image data by referring to the table.

Each pixel of the pixel array 110 may operate in any one among the HCG mode and the LCG mode, and the mode of each pixel may be determined by the strength (or illuminance) of light entering each pixel. The HCG mode may mean a mode in which a pixel has a relatively high conversion gain, and the LCG mode may mean a mode in which a pixel has a relatively low conversion gain. Here, the conversion gain may mean a ratio of the level (i.e., voltage) of a pixel signal converted from the photo charges with respect to the quantity of photo charges generated in the pixel. As the quantity of photo charges generated in the pixel is proportional to the illuminance of each pixel, the HCG mode may mean a mode in which the change in the pixel signal according to the change in the illuminance is relatively large, and the LCG mode may mean a mode in which the change in the pixel signal according to the change in the illuminance is relatively small.

That is, it may be said that the slope of the pixel signal with respect to the illuminance is different in the HCG mode and the LCG mode. The gain may be a correction value for making the slope of the pixel signal (or image data) with respect to the illuminance of a pixel operating in the HCG mode the same as the slope of the pixel signal (or image data) with respect to the illuminance of a pixel operating in the LCG mode.

The image compositing unit 320 may synthesize an HDR image corresponding to a high dynamic range using image data of pixels operating in the HCG mode and/or image data of pixels operating in the LCG mode.

According to an embodiment, the image compositing unit 320 may use the gain provided from the gain processing unit 310 in the operation of the image data of pixels operating in the HCG mode and/or the image data of pixels operating in the LCG mode, and generate an HDR image from the operated image data.

The ISP 300 may transmit image signal-processed image data (i.e., HDR image) to the input/output interface 400.

According to another embodiment, the gain processing unit 310 and the image compositing unit 320 for generating an HDR image may be included in the image sensing device 100, rather than the ISP 300.

The input/output interface 400 may perform communication with the host device 20 and transmit the image signal-processed image data to the host device 20. According to an embodiment, the input/output interface 400 may be a mobile industry processor interface (MIPI), but the scope is not limited thereto.

The host device 20 may be a processor (e.g., an application processor) for processing the image signal-processed image data received from the imaging device 10, a memory (e.g., non-volatile memory) for storing the image data, and a display device (e.g., liquid crystal display (LCD)) for visually outputting the image data.

Figure 3:
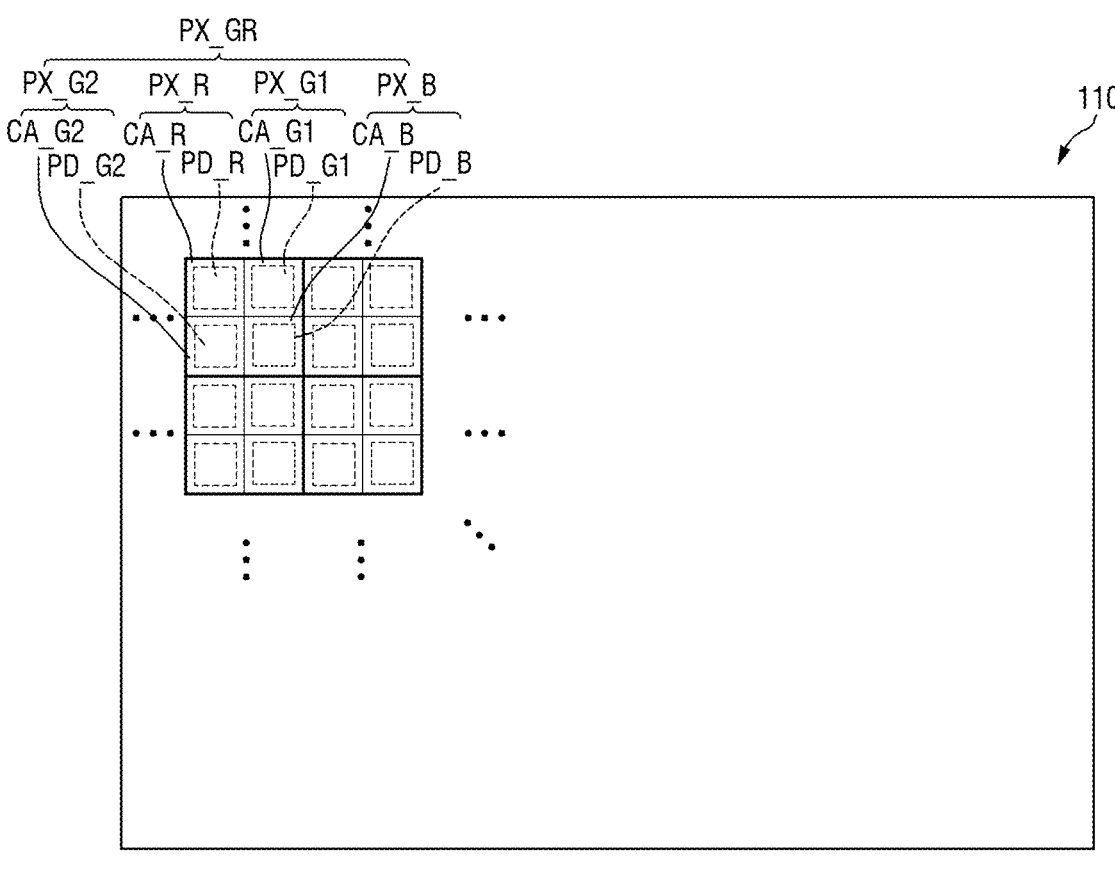
FIG. 3 is a schematic plan view showing the pixel array according to FIG. 2.
Figure 3:
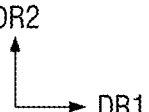

FIG. 3 is a plan view showing the pixel array according to FIG. 2 in detail.

Referring to FIG. 3, the pixel array 110 according to an embodiment may include a pixel group PX_GR. The pixel groups PX_GR may be provided in plurality, and the plurality of pixel groups PX_GR may be arranged in a first direction DR1 and a second direction DR2 intersecting the first direction DR1.

The pixel group PX_GR may include a plurality of sub-pixels. The plurality of sub-pixels may include a first sub-pixel PX_R, a second sub-pixel PX_G1, a third sub-pixel PX_G2, and a fourth sub-pixel PX_B.

In the example as shown in FIG. 3, the second sub-pixel PX_G1 may be located on one side in the first direction DR1 of the first sub-pixel PX_R, the third sub-pixel PX_G2 may be located on the other side in the second direction DR2 of the first sub-pixel PX_R, and the fourth sub-pixel PX_B may be located on the other side in the second direction DR2 of the second sub-pixel PX_G1. Such arrangement of the sub-pixels is the example only and other implementations are also possible without being limited thereto.

In the example, the first sub-pixel PX_R may be a red pixel, the second sub-pixel PX_G1 and the third sub-pixel PX_G2 may be green pixels, and the fourth sub-pixel PX_B may be a blue pixel. However, other implementations are also possible. Thus, the embodiments of the present specification are not limited thereto.

The first sub-pixel PX_R may include a first photodiode region PD_R and a first circuit region CA_R surrounding the first photodiode region PD_R, the second sub-pixel PX_G1 may include a second photodiode region PD_G1 and a second circuit region CA_G1 surrounding the second photodiode region PD_G1, the third sub-pixel PX_G2 may include a third photodiode region PD_G2 and a third circuit region CA_G2 surrounding the third photodiode region PD_G2, and the fourth sub-pixel PX_B may include a fourth photodiode region PD_B and a fourth circuit region CA_B surrounding the fourth photodiode region PD_B.

Figure 4:
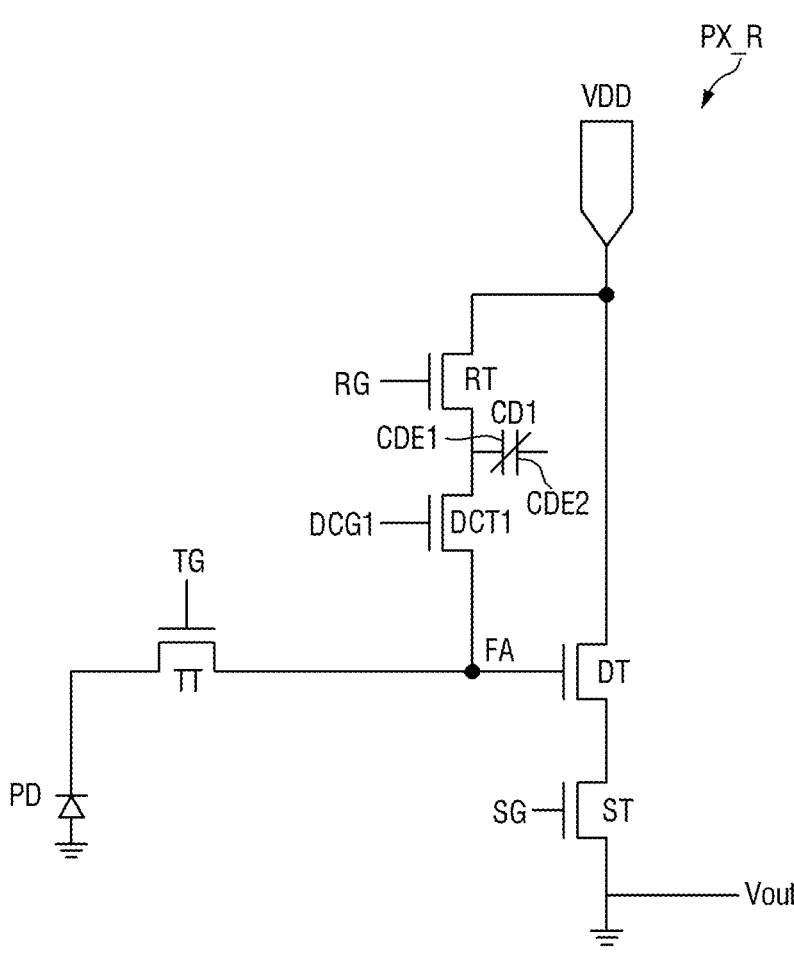
FIG. 4 is an equivalent circuit diagram showing a sub-pixel included in the pixel array of FIG. 3.
Figure 5:
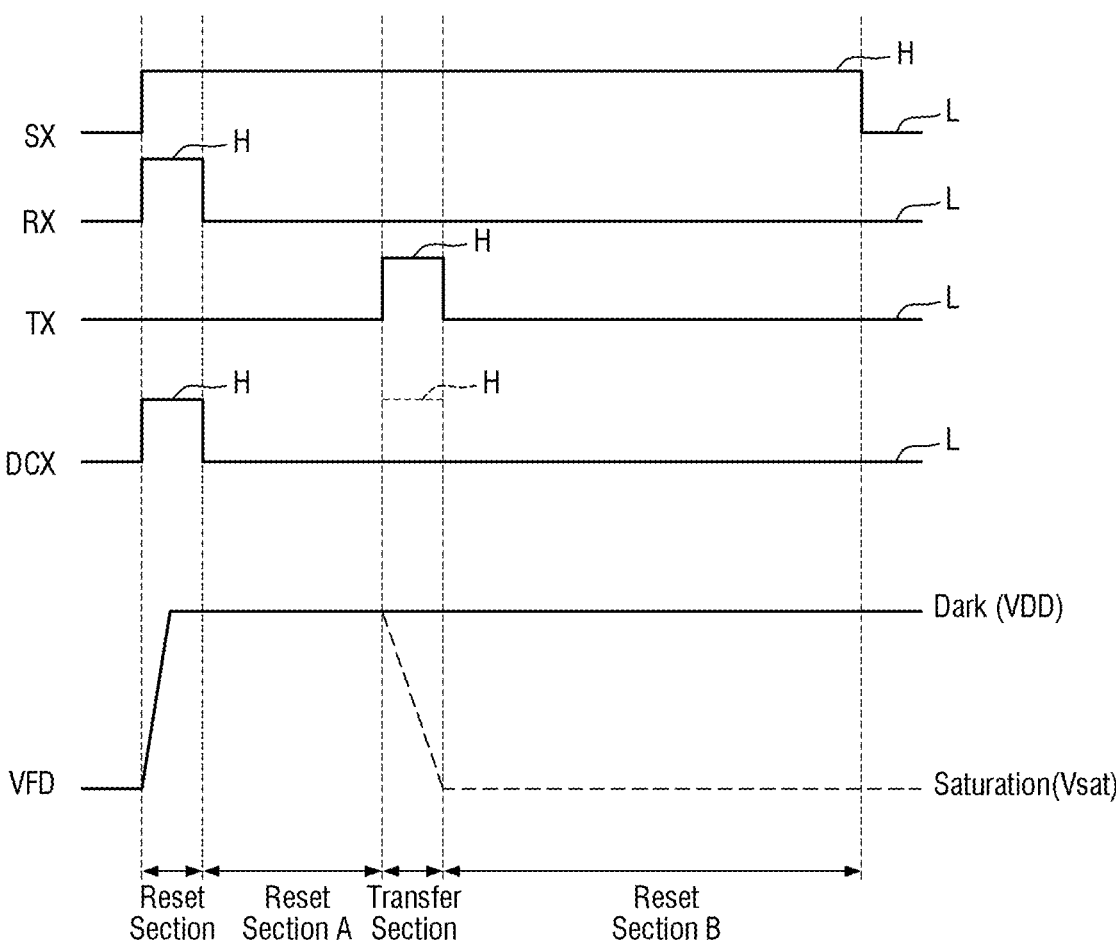
FIG. 5 is a timing diagram for explaining the operation of the pixel shown in FIG. 4.

FIG. 4 is an equivalent circuit diagram showing a sub-pixel included in the pixel array of FIG. 3. FIG. 5 is a timing diagram for explaining the operation of the pixel shown in FIG. 4.

Referring to FIGS. 3 to 5, the equivalent circuit diagram of a sub-pixel may correspond to an equivalent circuit of each sub-pixel included in the pixel array 110. FIG. 4 shows, for example, an equivalent circuit diagram of the first sub-pixel PX_R. The equivalent circuit diagrams of the second to fourth sub-pixels PX_G1, PX_G2, and PX_B are substantially the same as that of the first sub-pixel PX_R.

The first sub-pixel PX_R may include a photoelectric conversion device PD, a transfer transistor TT, a reset transistor RT, a floating diffusion region FA, a driver transistor DT, a selection transistor ST, a first dual conversion gain (DCG) transistor DCT1, and a first DCG capacitor CD1. In the example, a pixel may have a 5-transistor (5TR) pixel structure.

The photoelectric conversion device PD may respond to the incident light to generate and accumulate photo charges corresponding to the strength of incident light. For example, the photoelectric conversion device PD may be implemented to include a photoelectric conversion element or circuit such as a photodiode, a photo transistor, a photo gate, a pinned photodiode, or a combination of these. When the photoelectric conversion device PD is implemented as a photodiode, it may be a region doped with impurities of a second conductivity type (e.g., N-type) in a substrate having a first conductivity type (e.g., P-type).

The floating diffusion region FA may be used to receive accumulate the photo charges the photo charges generated in the photoelectric conversion device PD. For example, the floating diffusion region FA may include a region doped with impurities of a second conductivity type (e.g., N-type) in a substrate having a first conductivity type (e.g., P-type). The floating diffusion region FA may include an electrically conductive layer or electrode as a floating diffusion electrode FD over its region doped with impurities to receive an electrical control voltage as shown in FIGS. 9-13. Accordingly, the substrate and the region doped with impurities of the floating diffusion region FA may be modeled as a junction capacitor. The effective capacitance of the floating diffusion region FA is dictated by the capacitor formed by the floating diffusion electrode FD and one or more additional capacitors that may be electrically connected to the capacitor formed by the floating diffusion electrode FD in parallel based on one or more transistors that may impact such connections, such as the first DCG capacitor CD1 as further explained below. The floating diffusion region FA may be connected to the gate electrode of the driver transistor DT, the drain electrode of the transfer transistor TT, and the drain electrode of the first DCG transistor DCT1.

The charge transfer from the photoelectric conversion device PD to the floating diffusion region FA is controlled by the transfer transistor TT connected between the photoelectric conversion device PD and the floating diffusion region FA as shown in FIG. 4. The transfer transistor TT may be turned on or off in response to the transfer signal TX applied to the gate electrode TG, and the turned-on transfer transistor TT may transfer photo charges accumulated in the photoelectric conversion device PD to the floating diffusion region FA. The source electrode of the transfer transistor TT may be connected to the photoelectric conversion device PD, and the drain electrode may be connected to the floating diffusion region FA.

The reset transistor RT may be connected between the power supply voltage VDD and the floating diffusion region FA, and reset the voltage of the floating diffusion region FA to the power supply voltage VDD in response to the pixel reset signal RX applied to the gate electrode RG. The power supply voltage VDD may be applied to the source electrode of the reset transistor RT, and the drain electrode may be connected to the source electrode of the first DCG transistor DCT1.

The driver transistor DT may be connected between the power supply voltage VDD and the selection transistor ST, and amplify the change in the electrical potential of the floating diffusion region FA that receives the photo charges accumulated in the photoelectric conversion device PD, and transmit the electrical potential to the selection transistor ST. The gate electrode of the driver transistor DT may be connected to the floating diffusion region FA, in which the power supply voltage VDD is applied to the source electrode, and the drain electrode may be connected to the source electrode of the selection transistor ST.

The selection transistor ST may be connected between the driver transistor DT and the output signal line (or column line), and is turned on by the row selection signal SX applied to the gate electrode SG to output the electrical signal transferred from the driver transistor DT as a pixel signal Vout. The source electrode of the selection transistor ST may be connected to the drain electrode of the driver transistor DT.

A DCG signal DCX may be applied to the gate electrode DCG1 of the first DCG transistor DCT1, the source electrode may be connected to the drain electrode of the reset transistor RT, and the drain electrode may be connected to the floating diffusion region FA. As shown in FIG. 3, although the transistors TT, RT, DT, DCT1, and ST may be implemented as N-channel metal oxide semiconductor (NMOS) transistors, they are not limited thereto, and may be implemented as P-channel metal oxide semiconductor (PMOS) transistors.

The first DCG transistor DCT1 may be turned on or turned off in response to the DCG signal DCX applied to the gate electrode DCG1. The first DCG transistor DCT1 may be turned off or turned on according to the HCG mode and the LCG mode. For example, the first DCG transistor DCT1 may be turned off in the HCG mode, and the first DCG transistor DCT1 may be turned on in the LCG mode.

The voltage of the floating diffusion region FA may be determined by the quantity of photo charges transferred through the transfer transistor TT, and as the quantity of photo charges increases, the voltage of the floating diffusion region FA may be lowered.

Referring to FIG. 4, when the first DCG transistor DCT1 is turned on, the first electrode CDE1 of the first DCG capacitor CD1 is electrically connected to the floating diffusion region electrode FD of the floating diffusion region FA so that the first DCG capacitor CD1 and the capacitor formed by the floating diffusion region electrode FD of the floating diffusion region FA may be electrically connected in parallel. As such, turning on of the first DCG transistor DCT1 may provide an additional capacitance of the first DCG capacitor CD1 to the capacitance associated with the floating diffusion region FA by effectuating an additional capacitance corresponding to the sum of the parasitic capacitance of the first DCG transistor DCT1 and the capacitance of the first DCG capacitor CD1 to the floating diffusion region FA. When the first DCG transistor DCT1 is turned off, the first DCG transistor DCT1 may not provide such additional capacitance corresponding to the sum of the parasitic capacitance of the first DCG transistor DCT1 and the capacitance of the first DCG capacitor CD1 to the floating diffusion region FA. Thus, the effective capacitance of the floating diffusion region FA when the first DCG transistor DCT1 is turned on may be greater than the capacitance of the floating diffusion region FA when the first DCG transistor DCT1 is turned off.

In some implementations, each of the transfer signal TX, the pixel reset signal RX, the row selection signal SX, and the DCG signal DCX may be supplied from the row driver 120. However, other implementations are also possible without being limited thereto.

The first DCG capacitor CD1 is a capacitor with a predetermined capacitance and may include a first electrode CDE1 and a second electrode CDE2 opposing the first electrode CDE1. The first electrode CDE1 may be connected to the drain electrode of the reset transistor RT and the source electrode of the first DCG transistor DCT1.

In the example, the first DCG capacitor CD1 may be configured as, for example, a Metal-Insulator-Metal (MIM) capacitor, a Metal-Insulator-Polysilicon (MIP) capacitor, a Metal-Oxide-Semiconductor (MOS) capacitor, or a junction capacitor. However, other implementations are also possible.

According to the sub-pixel PX_R shown in FIGS. 3 to 5, as the capacitance corresponding to the capacitance of the first DCG capacitor CD1, as well as the capacitance corresponding to the parasitic capacitance of the first DCG transistor DCT1, may be additionally provided to the floating diffusion region FA, a relatively large capacitance may be provided to the floating diffusion region FA by adjusting the capacitance of the first DCG capacitor CD1.

FIGS. 3 to 5 show certain components of the sub-pixel PX_R and signal timing charts of various signals in connection with the operation of the sub-pixel PX_R, including the row selection signal SX, the reset control signal RX, the DCG signal DCX, the transfer signal TX, and the voltage VFD of the floating diffusion region FA. Each of the row selection signal SX, reset control signal RX, transfer signal TX, and DCG signal DCX may have an activation voltage H or a deactivation voltage L. When each of the row selection signal SX, reset control signal RX, transfer signal TX, and DCG signal DCX has an activation voltage H, a corresponding transistors ST, RT, TT, or DCT1 may be turned on. On the contrary, when each of the row selection signal SX, reset control signal RX, transfer signal TX, and DCG signal DCX has a deactivation voltage L, a corresponding transistors ST, RT, TT, or DCT1 may be turned off.

The operation of the sub-pixel PX_R may be divided into a reset section, a first readout section (readout section A), a transfer section, and a second readout section (readout section B). The row selection signal SX may be maintained at the activation voltage H during these four sections.

First, in the reset section, as the reset transistor RT is turned on while each of the reset control signal RX and the DCG signal DCX has an activation voltage H, the voltage VFD of the floating diffusion region FA may be reset to the power supply voltage VDD.

In the first readout section, a reference signal, which is an electrical signal corresponding to the reset floating diffusion region FA, may be output through the driver transistor DT and the selection transistor ST. Although it is shown in FIG. 5 for convenience of explanation that the voltage of the floating diffusion region FA in the reset section and the first readout section is constant, the voltage of the floating diffusion region FA may vary due to various factors (e.g., coupling of the floating diffusion region FA with other adjacent elements).

In the transfer section, as the transfer transistor TT is turned on while the transfer signal TX has an activation voltage H, the photo charges of the photoelectric conversion device PD may move to the floating diffusion region FA. Accordingly, the voltage VFD of the floating diffusion region FA may vary according to the quantity of the moved photo charges.

In the second readout period, as the movement of the photo charges is completed, the voltage VFD of the floating diffusion region FA may be a voltage corresponding to the quantity of photo charges.

When there are no photo charges transferred to the floating diffusion region FA (dark), the voltage VFD of the floating diffusion region FA may be equal to the power supply voltage VDD.

When the quantity of photo charges transferred to the floating diffusion region FA is greater than the maximum capacitance of the floating diffusion region FA (Saturation), the voltage VFD of the floating diffusion region FA may be a saturation voltage Vsat lower than the power supply voltage VDD as much as a predetermined voltage. Here, the saturation voltage Vsat may be determined according to the maximum capacitance of the floating diffusion region FA, and the maximum capacitance may mean the capacitance of a case where the first DCG transistor DCT1 is turned on and thus the additional capacitance is provided to the floating diffusion region FA.

Compared to a case where there are no photo charges transferred to the floating diffusion region FA (dark), the voltage VFD of the floating diffusion region FA may gradually decrease as the quantity of photo charges increases.

As the first DCG transistor DCT1 is turned on and the capacitance of the floating diffusion region FA increases, the quantity of photo charges may not exceed the capacitance of the floating diffusion region FA although the quantity of photo charges further increases. That is, the floating diffusion region FA may accommodate more photo charges than the capacitance (hereinafter, referred to as 'first capacitance') in a state where no additional capacitance is provided to the floating diffusion region FA, and although the quantity of photo charges increases to exceed the first capacitance, the voltage VFD of the floating diffusion region FA may decrease gradually. However, decrease in the voltage VFD of the floating diffusion region FA according to the quantity of photo charges may be smaller when the floating diffusion region FA has a capacitance (hereinafter, referred to as 'second capacitance') in a state where additional capacitance is provided to the floating diffusion region FA, compared to a case where the floating diffusion region FA has the first capacitance. This is since the first capacitance is smaller than the second capacitance, and as the capacitance of the floating diffusion region FA decreases, the change in the voltage VFD of the floating diffusion region FA due to the change in the quantity of photo charges may increase.

When the floating diffusion region FA has a first capacitance, the sub-pixel PX_R may have a relatively high conversion gain. That is, a sub-pixel in which the floating diffusion region FA has the first capacitance may be defined as a pixel operating in the HCG mode.

When the floating diffusion region FA has a second capacitance, the sub-pixel PX_R may have a relatively low conversion gain. That is, a pixel in which the floating diffusion region FA has the second capacitance may be defined as a pixel operating in the LCG mode.

As shown in this specification, when the first DCG transistor DCT1 is included, the range capable of converting the quantity of photo charges into an electrical signal corresponding to the quantity of photo charges may be expanded. This may expand the dynamic range, which is the range of illuminance, in which a pixel may have an effective response (pixel signal or image data corresponding to the strength of incident light).

Figure 6:
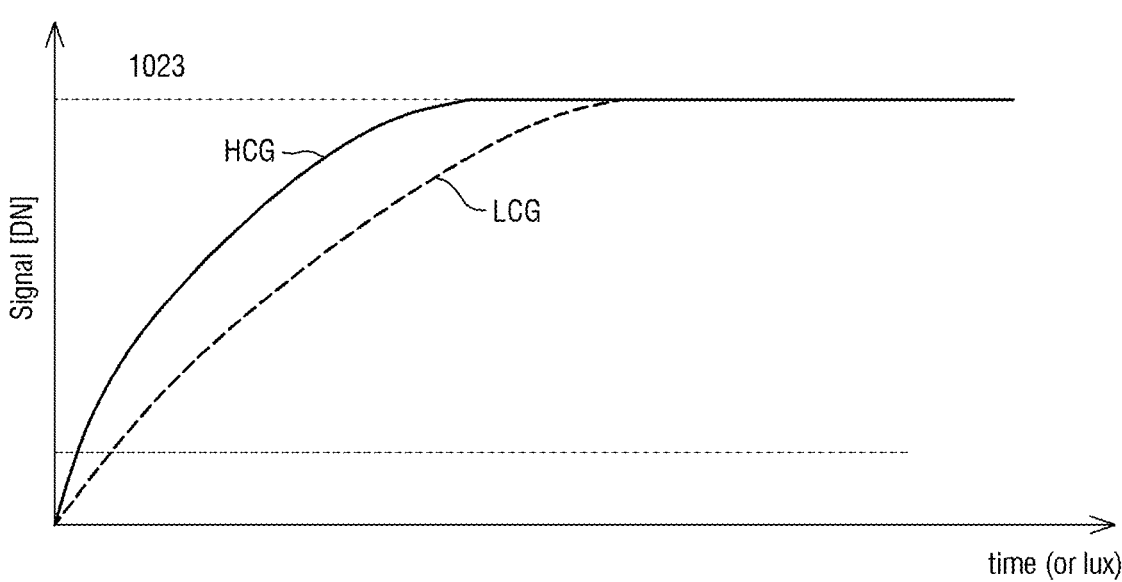
FIG. 6 is a graph for explaining an HCG mode and an LCG mode.
Figure 7:
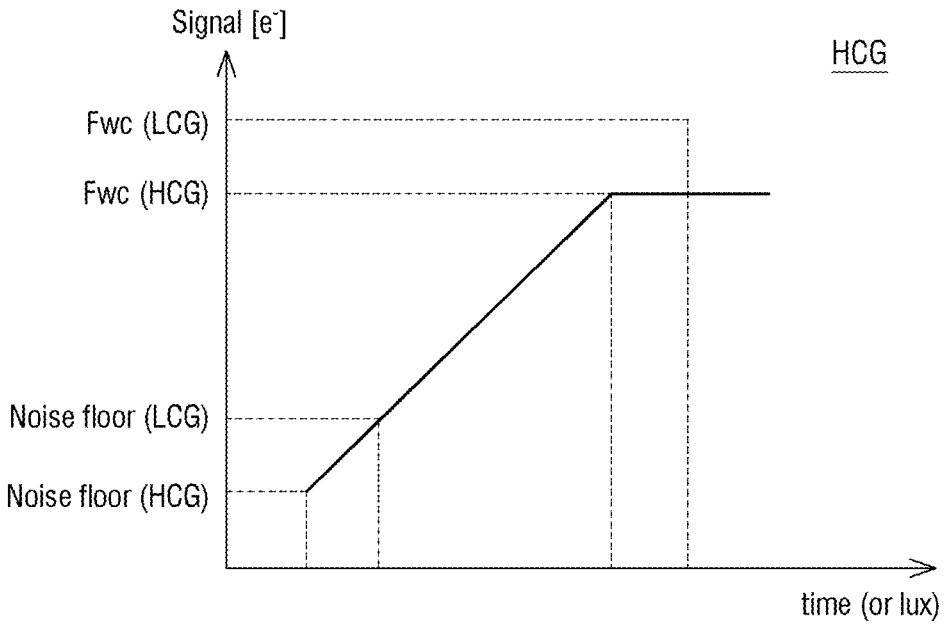
FIG. 7 is a graph showing signal strength according to time (or light amount) in the HCG mode.
Figure 8:
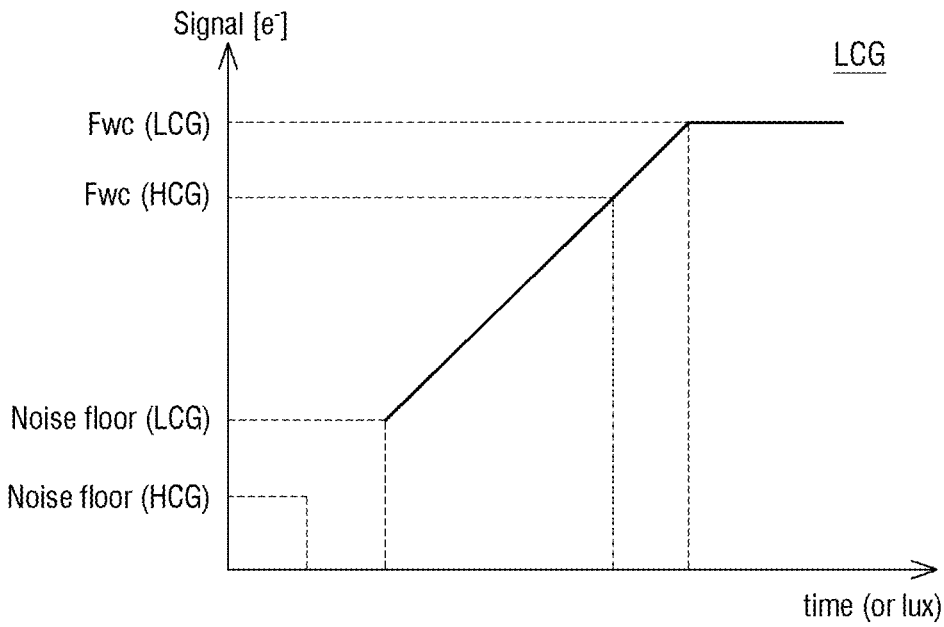
FIG. 8 is a graph showing signal strength according to time (or light amount) in the LCG mode.

FIG. 6 is a graph for explaining an HCG mode and an LCG mode. FIG. 7 is a graph showing signal strength according to time (or light amount) in the HCG mode. FIG. 8 is a graph showing signal strength according to time (or light amount) in the LCG mode.

Referring to FIG. 6, the horizontal axis represents time or an amount of light (lux), and the vertical axis represents signal strength (Signal [DN]). Here, when the horizontal axis represents time, signal strength is measured while a constant amount of light is provided over time, and when the horizontal axis is an amount of light (lux), signal strength may be measured while increasing the amount of light during a fixed time. In this specification, signal strength (Signal [DN]) means a digital number that the sensing device 100 may express, and although the limit strength of the signal strength (Signal [DN]) may be, for example, 1023, the embodiments of the present specification are not limited thereto. Generally, a conversion gain (CG) may be inversely proportional to the capacitance of the floating diffusion region (see FA in FIG. 4). For example, when the capacitance of the floating diffusion region (see FA in FIG. 4) decreases, the CG increases (see HCG), and when the capacitance of the floating diffusion region (see FA in FIG. 4) increases, the CG may decrease (see LCG).

As shown in FIG. 6, since the capacitance of the floating diffusion region FA is small in the HCG mode, the capacitance of the floating diffusion region FA is large in the LCG mode, and the limit strength of the signal strength (Signal [DN]) is fixed to 1023, the rising slope of the signal strength (Signal [DN]) in the HCG mode may be greater than that in the LCG mode according to the time or amount of light (lux).

In FIGS. 7 and 8, the vertical axis represents the signal strength (Signal [e−]) and may be the quantity of photo charges charged in the floating diffusion region FA. In addition, the noise floor and full well capacity (Fwc) in each of the LCG mode and the HCG mode are displayed on the vertical axis. The noise floor in the LCG mode may be higher than the noise floor in the HCG mode. That is, as the capacitance of the floating diffusion region (see FA in FIG. 4) in the LCG mode is higher than in the HCG mode, noise may be more likely to generate compared to the HCG mode when the signal strength (Signal [e−]) is the same. Accordingly, in the LCG mode, the signal-to-noise-ratio (SNR) may be increased by lowering the noise floor and thus reducing the influence of noise. In addition, as described above, since the capacitance of the floating diffusion region in the LCG mode (see FA in FIG. 4) is higher than in the HCG mode, the full well capacity Fwc, which is the maximum capacitance that can be charged in the floating diffusion region (see FA in FIG. 4) to the maximum, may be higher than in the HCG mode. For example, the conversion ratio of CG of the HCG mode and the LCG mode may be the ratio between the CG value in the HCG mode and the CG value in the LCG mode. As described above, the CG value may be inversely proportional to the capacitance of the floating diffusion region (see FA in FIG. 4). Therefore, as the difference between the maximum value of the capacitance of the floating diffusion region (see FA in FIG. 4) and the minimum value of the capacitance of the floating diffusion region (see FA in FIG. 4) increases, the conversion ratio of CG of the HCG mode and the LCG mode can be increased. The minimum value of the capacitance of the floating diffusion region (see FA in FIG. 4) may not change significantly. The minimum value of the capacitance of the floating diffusion region FA may be the capacitance of the floating diffusion region FA of a state where the first DCG transistor DCT1 is turned off. The maximum value of the capacitance of the floating diffusion region FA may be the capacitance of the floating diffusion region FA of a state where the first DCG transistor DCT1 is turned on.

Hereinafter, the pixel array 110 according to an embodiment will be described.

Figure 9:
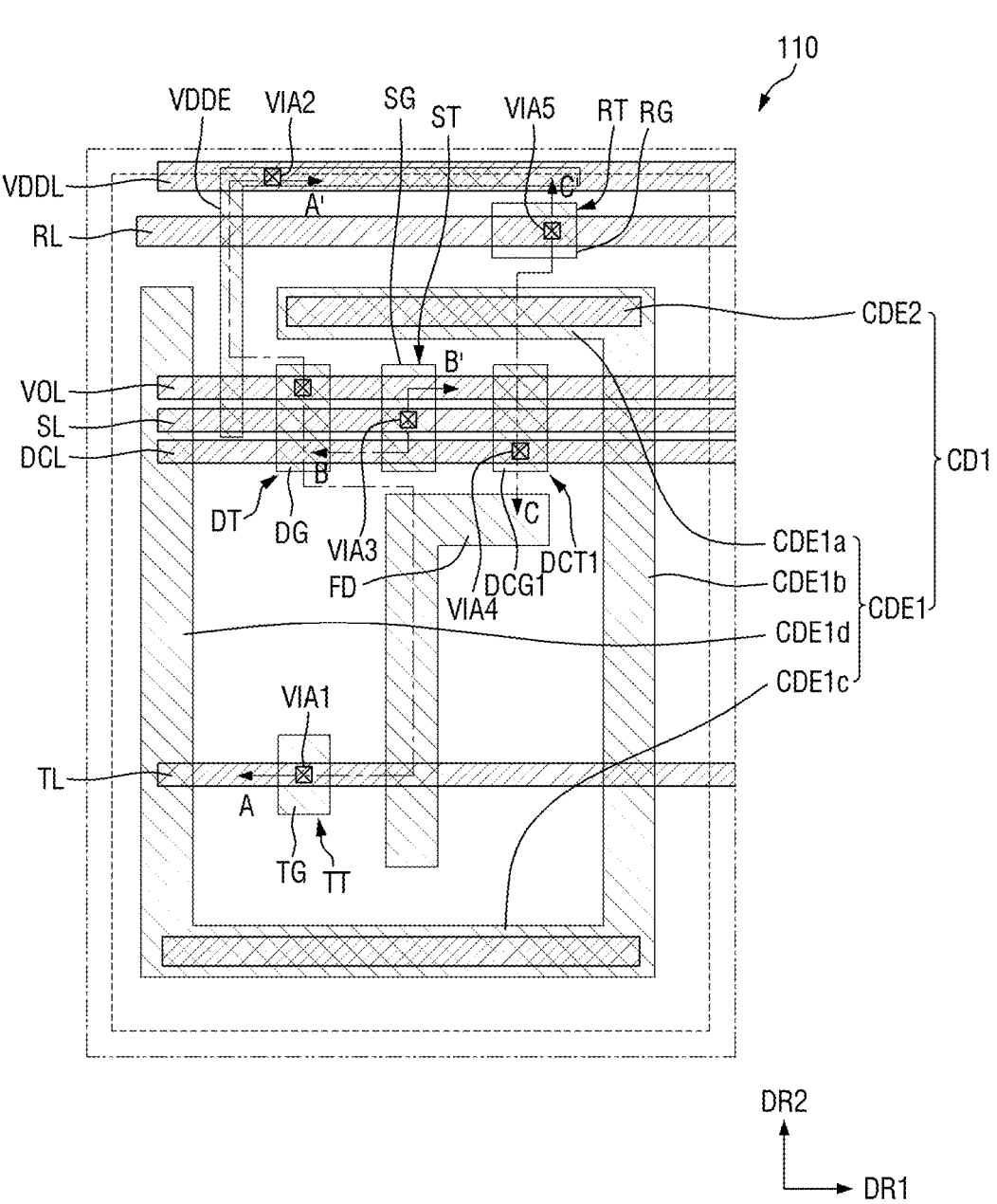
FIG. 9 is a detailed plan view showing a pixel array according to an embodiment.
Figure 10:
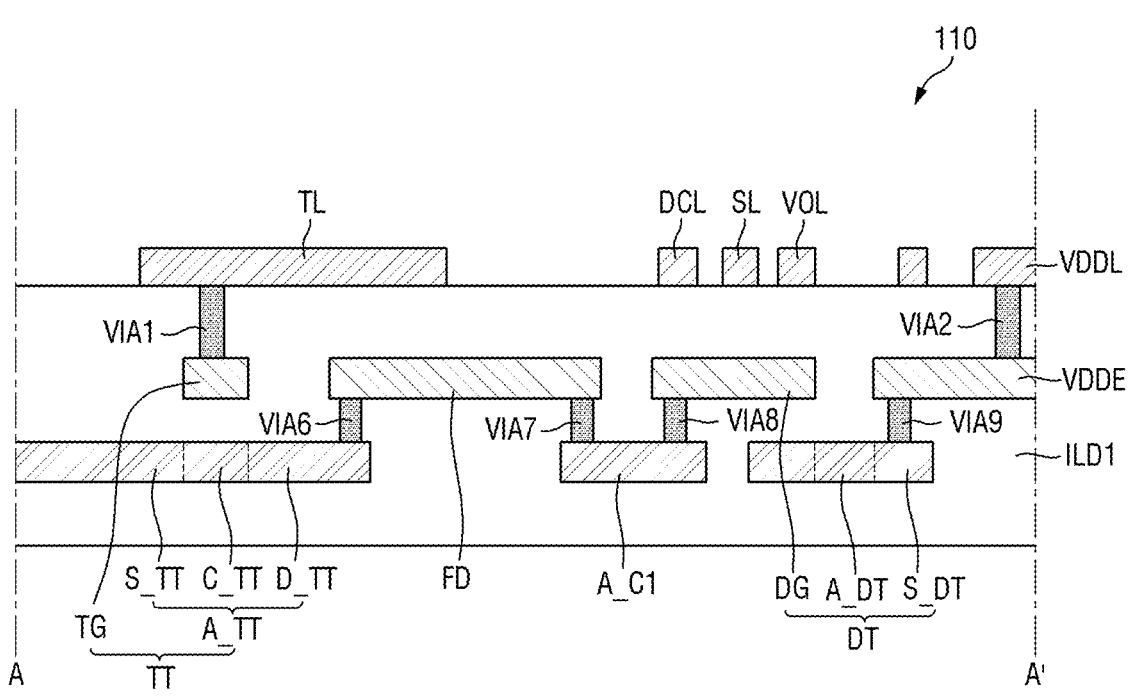
FIG. 10 is a cross-sectional view taken along line A-A' of FIG. 9.
Figure 11:
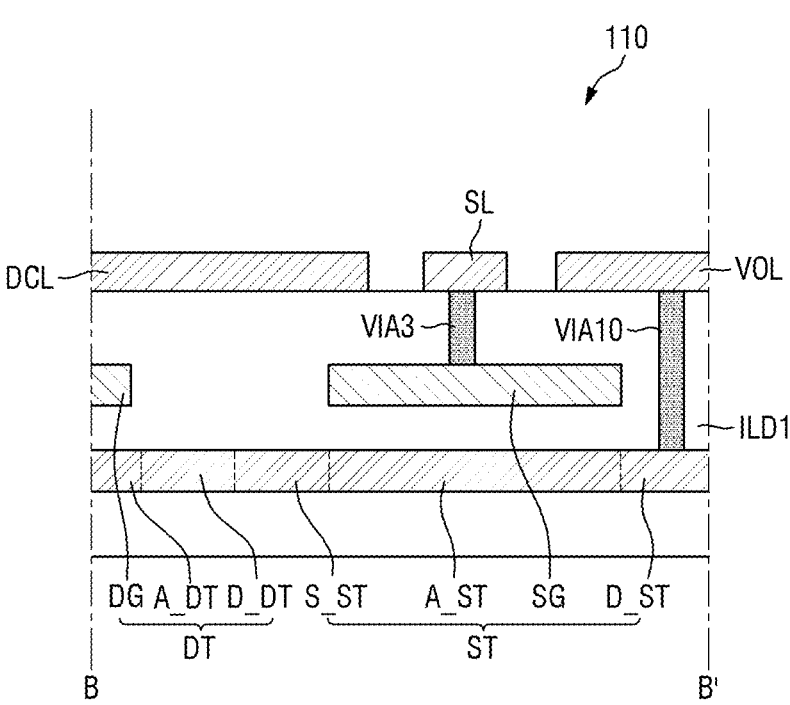
FIG. 11 is a cross-sectional view taken along line B-B' of FIG. 9.
Figure 12:
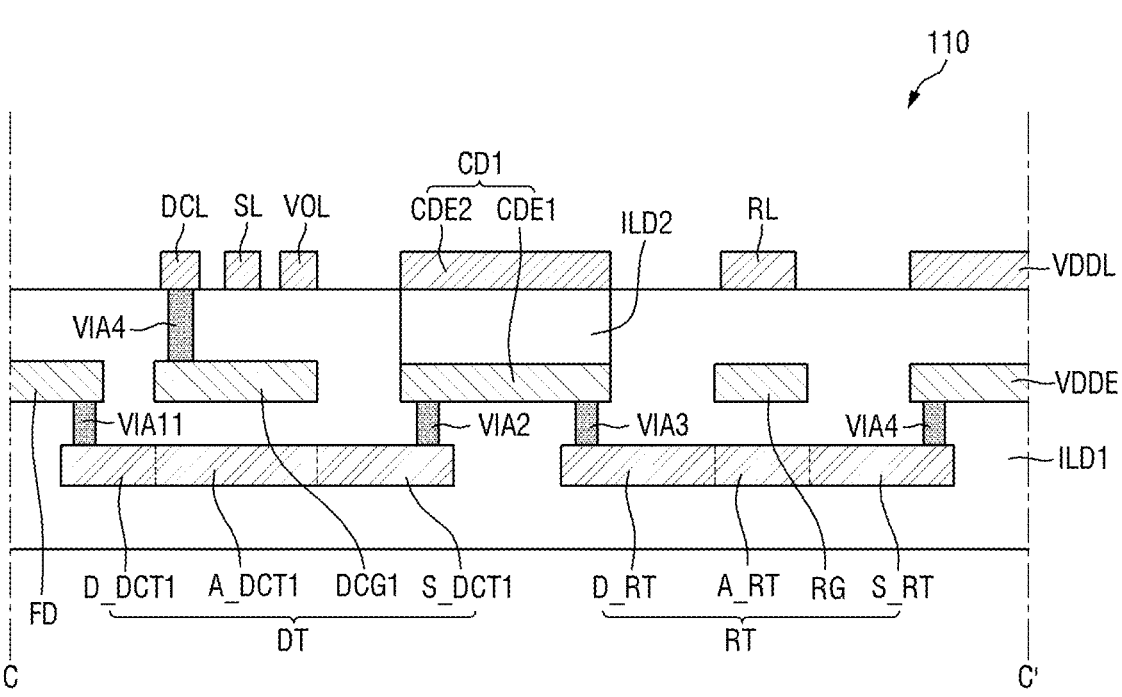
FIG. 12 is a cross-sectional view taken along line C-C' of FIG. 9.

FIG. 9 is a detailed plan view showing a pixel array according to an embodiment. FIG. 10 is a cross-sectional view taken along line A-A' of FIG. 9. FIG. 11 is a cross-sectional view taken along line B-B' of FIG. 9. FIG. 12 is a cross-sectional view taken along line C-C' of FIG. 9.

Referring to FIGS. 4, and 9 to 12, although the pixel array 110 shown in FIG. 9 may be, for example, an array that shows in detail the circuit region CA_R of the first sub-pixel PX_R of FIG. 4, this specification is not limited thereto.

The pixel array 110 may include a first metal layer and a second metal layer on the first metal layer. For example, the first metal layer may include a floating diffusion electrode FD, a gate electrode DCG1 of the first DCG transistor DCT1, a gate electrode SG of the selection transistor ST, a gate electrode DG of the driver transistor DT, a gate electrode RG of the reset transistor RT, a gate electrode TG of the transfer transistor TT, a first electrode CDE1 of the first DCG capacitor CD1, and a power supply voltage electrode VDDE. The second metal layer may include a DCG signal line DCL, a selection signal line SL, a reset signal line RL, a transfer signal line TL, a power supply voltage line VDDL, a second electrode CDE2 of the first DCG capacitor CD1, and an output signal line VOL.

The floating diffusion electrode FD may be arranged in the floating diffusion region FA. The minimum value of the capacitance of the floating diffusion region FA may be determined by the capacitance formed between the floating diffusion electrode FD and surrounding electrodes.

The gate electrode SG of the selection transistor ST, the gate electrode DG of the driver transistor DT, and the gate electrode DCG1 of the first DCG transistor DCT1 may be arranged on one side in the second direction DR2 of the floating diffusion electrode FD. The gate electrode TG of the transfer transistor TT may be arranged on the other side in the first direction DR1 of the floating diffusion electrode FD. The gate electrode RG of the reset transistor RT may be arranged on one side in the second direction DR2 of the gate electrode DCG1 of the first DCG transistor DCT1. The power supply voltage electrode VDDE may be arranged on the other side in the first direction DR1 of the gate electrode DG of the driver transistor DT. Although the power supply voltage electrode VDDE may be extended in one direction of the second direction DR2 and then be bent and extended in one direction of the first direction DR1, the embodiments of the present specification are not limited thereto.

The first electrode CDE1 of the first DCG capacitor CD1 may roughly surround the floating diffusion electrode FD, the gate electrode DCG1 of the first DCG transistor DCT1, the gate electrode SG of the selection transistor ST, the gate electrode DG of the driver transistor DT, the gate electrode RG of the reset transistor RT, and the gate electrode TG of the transfer transistor TT. For example, the first electrode CDE1 may include a first electrode unit CDE1a extended along the first direction DR1, a second electrode unit CDE1b connected to the first electrode unit CDE1a and extended in the other direction of the second direction DR2, a third electrode unit CDE1c connected to the second electrode unit CDE1b and extended in the other direction of the first direction DR1, and a fourth electrode unit CDC1d connected to the third electrode unit CDE1c and extended in one direction of the second direction DR2. The first electrode unit CDE1a and the fourth electrode unit CDE1d may be spaced apart from each other in the first direction DR1.

The first electrode unit CDE1a may be arranged between the gate electrode RG of the reset transistor RT and the gate electrode DCG1 of the first DCG transistor DCT1. The second electrode unit CDE1b may be located on one side in the first direction DR1 of the floating diffusion electrode FD. The third electrode unit CDE1c may be located on the other side in the second direction DR2 of the floating diffusion electrode FD. The fourth electrode unit CDE1d may be located on the other side in the first direction DR1 of the gate electrode TG of the transfer transistor TT and the power supply voltage electrode VDDE.

The power supply voltage electrode VDDE may be arranged between the first electrode unit CDE1a and the fourth electrode unit CDE1d.

The transfer signal line TL may be electrically connected to the gate electrode TG of the transfer transistor TT through a first via hole VIA1. The transfer signal line TL may be extended along the first direction DR1.

The DCG signal line DCL may be electrically connected to the gate electrode DCG1 of the first DCG transistor DCT1 through a fourth via hole VIA4. The DCG signal line DCL may be extended along the first direction DR1.

The selection signal line SL may be electrically connected to the gate electrode SG of the selection transistor ST through a third via hole VIA3. The selection signal line SL may be extended along the first direction DR1.

The output signal line VOL may overlap the gate electrode SG of the selection transistor ST. The output signal line VOL may be extended along the first direction DR1.

The second electrode CDE2 may be provided in plurality, and each of the second electrodes CDE2 may overlap the first electrode unit CDE1a and the third electrode unit CDE1c. The second electrode CDE2 may be extended along the first direction DR1.

The power supply voltage line VDDL may be electrically connected to the power supply voltage electrode VDDE through a second via hole VIA2.

As shown in FIGS. 9 and 10, a semiconductor layer may be arranged under the first metal layer. Although the semiconductor layer may include a metal oxide semiconductor such as Indium-Gallium-Zinc Oxide (IGZO), or a silicon-based semiconductor material such as amorphous silicon, polycrystalline silicon, or the like, the embodiments of the present specification are not limited thereto.

A first insulating layer ILD1 may be arranged between the semiconductor layer and the first metal layer and between the first metal layer and the second metal layer to insulate the semiconductor layer from the first metal layer and the first metal layer from the second metal layer.

The semiconductor layer A_TT, S_TT, and D_TT of the transfer transistor TT may include a channel region A_TT overlapping the gate electrode TG, a drain electrode D_TT on one side of the channel region A_TT, and a source electrode S_TT on the other side of the channel region A_TT. The drain electrode D_TT may be electrically connected to the floating diffusion electrode FD through a sixth via hole VIA6.

The semiconductor layer may further include a connection pattern A_C1 overlapping the floating diffusion electrode FD. The gate electrode DG of the driver transistor DT may overlap the connection pattern A_C1. The connection pattern A_C1 may electrically connect the floating diffusion electrode FD and the gate electrode DG through seventh and eighth via holes VIA7 and VIA8, respectively.

The semiconductor layer may further include semiconductor layers A_DT and S_DT of the driver transistor DT. The semiconductor layers A_DT and S_DT of the driver transistor DT may include a channel region A_DT overlapping the gate electrode DG and a source electrode S_DT on one side of the channel region A_DT. The source electrode S_DT may be electrically connected to the power supply voltage electrode VDDE through a ninth via hole VIA9.

As shown in FIGS. 9 and 11, the semiconductor layer of the driver transistor DT may further include a drain electrode D_DT. The semiconductor layer may further include a semiconductor layer A_ST, S_ST, and D_ST of the selection transistor ST. The semiconductor layer A_ST, S_ST, and D_ST of the selection transistor ST may include a channel region A_ST overlapping the gate electrode SG, a drain electrode D_ST on one side of the channel region A_ST, and a source electrode S_ST on the other side of the channel region A_ST. The source electrode S_ST of the selection transistor ST may be electrically connected to the drain electrode D_DT of the driver transistor DT. The drain electrode D_ST may be electrically connected to the output signal line VOL through a tenth via hole VIA10.

As shown in FIGS. 9 and 12, the semiconductor layer may further include a semiconductor layer A_DCT1, S_DCT1, and D_DCT1 of the first DCG transistor DCT1. The semiconductor layer A_DCT1, S_DCT1, and D_DCT1 of the first DCG transistor DCT1 may include a channel region A_DCT1 overlapping the gate electrode DCG1, a source electrode S_DCT1 on one side of the channel region A_DCT1, and a drain electrode D_DCT1 on the other side of the channel region A_DCT1. The drain electrode D_DCT1 may be electrically connected to the floating diffusion electrode FD through an 11th via hole VIA11. The source electrode S_DCT1 may be electrically connected to the first electrode CDE1 through a twelfth via hole VIA12.

The semiconductor layer may further include a semiconductor layer A_RT, D_RT, and S_RT of the reset transistor RT. The semiconductor layer A_RT, D_RT, and S_RT of the reset transistor RT may include a channel region A_RT overlapping the gate electrode RG, a source electrode S_RT on one side of the channel region A_RT, and a drain electrode D_RT on the other side of the channel region A_RT. The drain electrode D_RT may be electrically connected to the first electrode CDE1 through a 13th via hole VIA13, and the source electrode S_RT may be electrically connected to the power supply voltage electrode VDDE through a 14th via hole VIA14.

As shown in FIGS. 10 to 12, generally, the first insulating layer ILD1 may be arranged between the first metal layer and the second metal layer and between the semiconductor layer and the first metal layer. The first insulating layer ILD1 may be an insulating layer with a low permittivity. In the example, the first insulating layer ILD1 may have an insulating material with the low permittivity relative to silicon dioxide. In the example, as further discussed later in this patent document, the first insulating layer ILD1 may have the permittivity lower than that of the second insulating layer ILD2. For example, the first insulating layer ILD1 may include SiCOH. In some implementations, the first insulating layer ILD1 may include an inorganic material having a low permittivity. The first insulating layer ILD1 may have various materials with low permittivity, without being limited to the examples mentioned above. The first insulating layer ILD1 may be arranged between the first metal layer and the second metal layer and between the semiconductor layer and the first metal layer. The first insulating layer ILD1 may be not disposed between the first electrode CDE1 and the second electrode CDE2. The first insulating layer ILD1 may be arranged between the gate electrodes TG, ST, RG, and DCG1 of the transistors TT, ST, RT, and DCT1 and the channel regions of the transistors TT, ST, RT, and DCT1. As the first insulating layer ILD1 has a low permittivity, delay between turn-on and turn-off of the transistors TT, ST, RT, and DCT1 can be minimized.

As described above, the CG value may be inversely proportional to the capacitance of the floating diffusion region (see FA in FIG. 4). Therefore, as the difference between the maximum value of the capacitance of the floating diffusion region (see FA in FIG. 4) and the minimum value of the capacitance of the floating diffusion region (see FA in FIG. 4) increases, the conversion ratio of CG of the HCG mode and the LCG mode can be increased. The minimum value of the capacitance of the floating diffusion region (see FA in FIG. 4) may not change significantly. The minimum value of the capacitance of the floating diffusion region FA may be the capacitance of the floating diffusion region FA of a state where the first DCG transistor DCT1 is turned off. The maximum value of the capacitance of the floating diffusion region FA may be the capacitance of the floating diffusion region FA of a state where the first DCG transistor DCT1 is turned on. Therefore, in a state where the first DCG transistor DCT1 is turned on, as the capacitance of the first DCG capacitor CD1 added to the floating diffusion region FA increases, the maximum value of the capacitance of the floating diffusion region FA may increase. According to the imaging device 10 of an embodiment, as a second insulating layer ILD2 having a high permittivity is arranged between the first electrode CDE1 and the second electrode CDE2, capacitance of the first DCG capacitor CD1 can be increased. According thereto, the conversion ratio of CG of the HCG mode and the LCG mode can be increased.

In the implementation, the permittivity of the second insulating layer ILD2 is higher than the permittivity of the first insulating layer ILD1. In the example, the permittivity of the second insulating layer ILD2 may be about 10 or higher. However, other implementations are also possible. For example, although the second insulating layer ILD2 may include $HfO_2$, $ZrO_2$, or $Al_2O_3$, the embodiments of the present specification are not limited thereto and the second insulating layer ILD2 can include materials other than the examples as mentioned above.

The side surface of the second insulating layer ILD2 may directly contact the side surface of the first insulating layer ILD1. For example, the thickness of the second insulating layer ILD2 may be about 30 to 50 nm. However, other implementations are also possible without being limited thereto.

Hereinafter, a pixel array according to another embodiment will be described. While describing the embodiments below, redundant description or detailed description of the reference numerals or components described in FIGS. 1 to 12 will be omitted.

Figure 13:
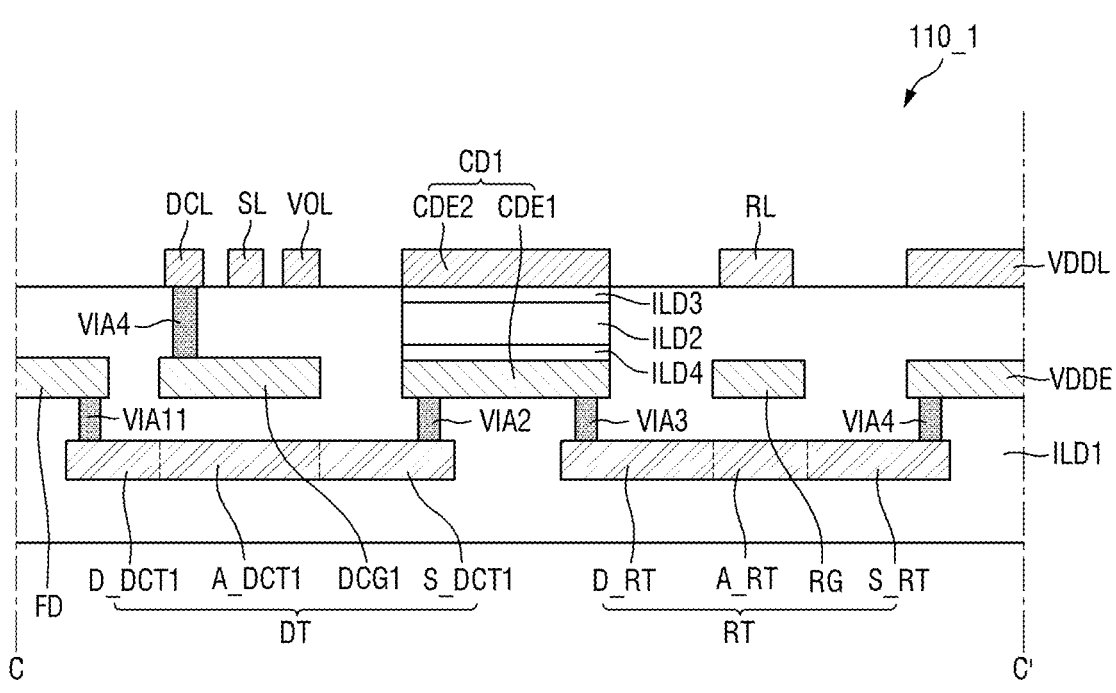
FIG. 13 is a cross-sectional view showing a pixel array according to another embodiment of the disclosed technology.

FIG. 13 is a cross-sectional view showing a pixel array according to another embodiment.

Referring to FIG. 13, the pixel array 110_1 according to this embodiment is different from the pixel array 110 according to FIGS. 9 to 12 in that the pixel array 110-1 further includes a third insulating layer ILD3 and a fourth insulating layer ILD4. The fourth insulating layer ILD4 may be arranged between the first electrode CDE1 and the second insulating layer ILD2 and the third insulating layer ILD3 arranged between the second insulating layer ILD2 and the second electrode CDE2.

Figure 14:
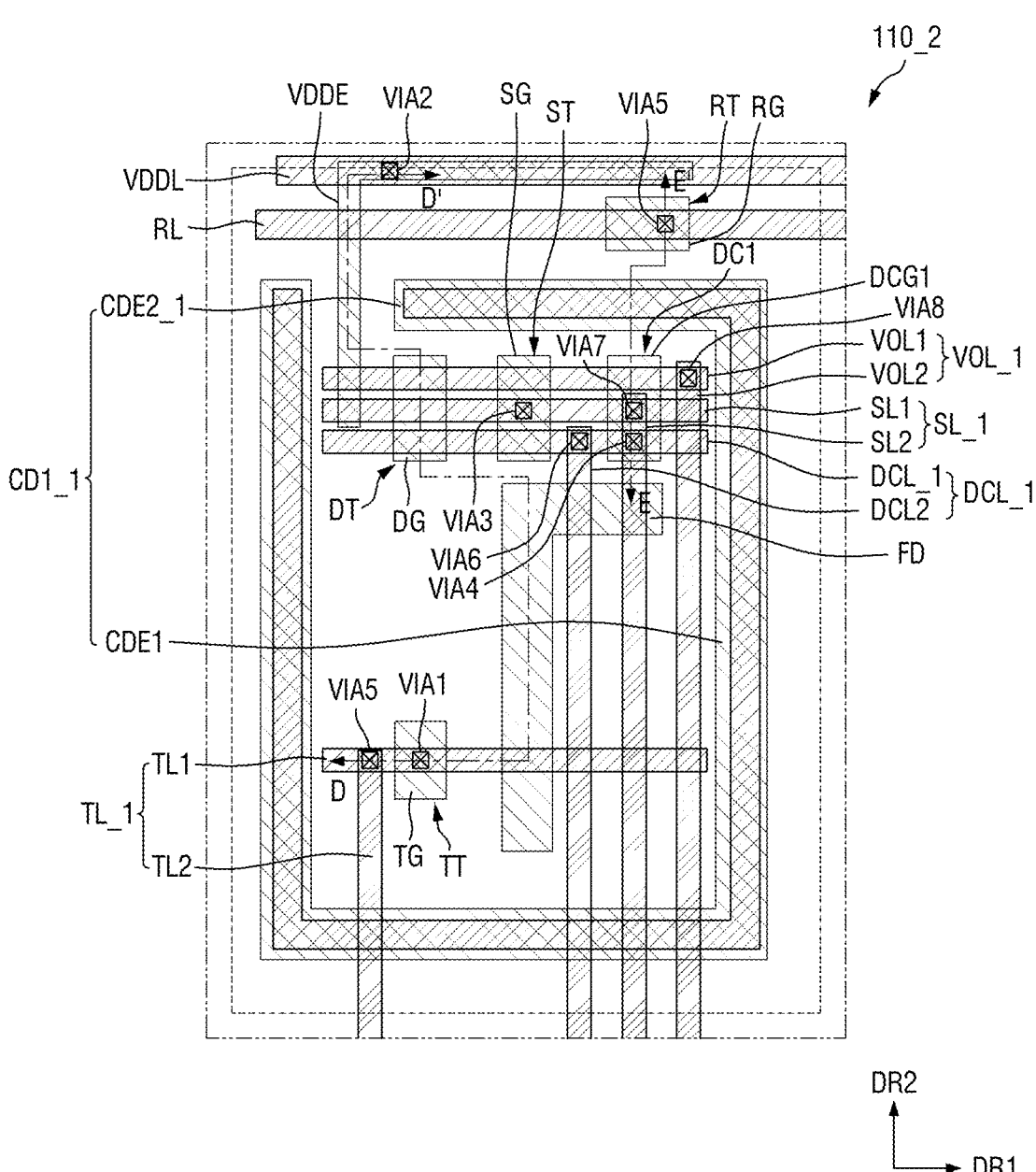
FIG. 14 is a detailed plan view showing a pixel array according to another embodiment.

In the implementations, the third and fourth insulating layers ILD3 and ILD4 may function of improving adhesion between the second insulating layer ILD2 and the electrodes CDE1 and CDE2, respectively. For example, each of the third and fourth insulating layers ILD3 and ILD4 may include the same insulating material. In another example, the third and fourth insulating layers ILD3 and ILD4 may include different insulating materials from each other. For example, each of the third and fourth insulating layers ILD3 and ILD4 may have the permittivity that is higher than the permittivity of the first insulating layer ILD1 and lower than the permittivity of the second insulating layer ILD2. However, other implementations are also possible. For example, each of the third and fourth insulating layers ILD3 and ILD4 may include $SiO_2$. However, other implementations are also possible. Thus, each of the third and fourth insulating layers ILD3 and ILD4 may include insulating material other than $SiO_2$. While FIG. 14 shows the third and fourth insulating layers ILD3 and ILD4 are included, other implementations are also possible. For example, either the third insulating layer ILD3 or the fourth insulating layer ILD4 may be omitted.

Figure 15:
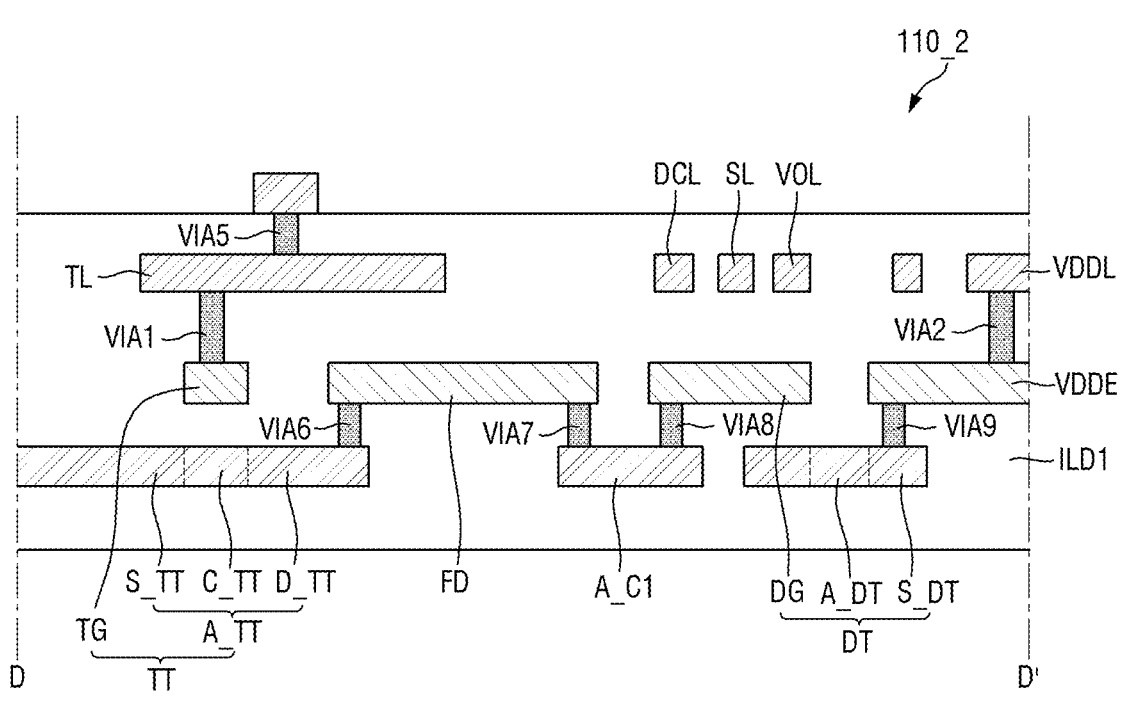
FIG. 15 is a cross-sectional view taken along line D-D' of FIG. 14.
Figure 16:
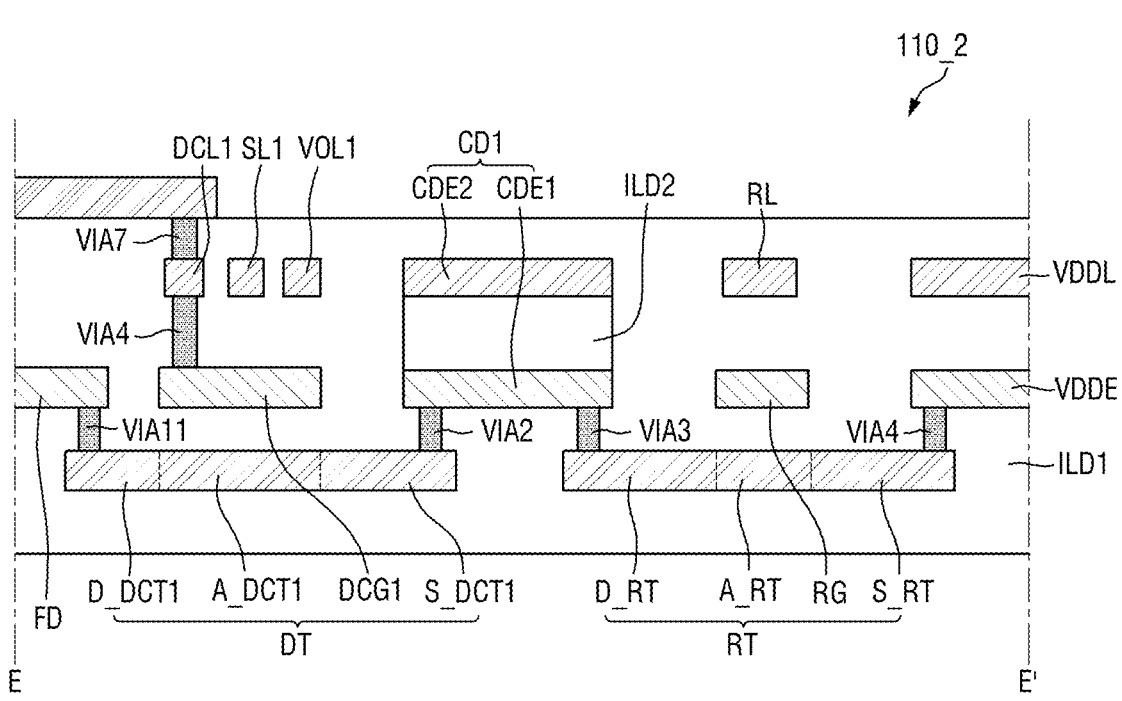
FIG. 16 is a cross-sectional view taken along line E-E' of FIG. 14.

FIG. 14 is a detailed plan view showing a pixel array according to another embodiment. FIG. 15 is a cross-sectional view taken along line D-D' of FIG. 14. FIG. 16 is a cross-sectional view taken along line E-E' of FIG. 14.

Referring to FIGS. 14 to 16, the pixel array 110_2 according to this embodiment is different from the pixel array 110 according to FIG. 9 in that it further includes a third metal layer.

The DCG signal line DCL_1 may include a first line DCL1 extended along the first direction DR1 and a second line DCL2 extended along the second direction DR2, the selection signal line SL_1 may include a first line SL1 extended along the first direction DR1 and a second line SL2 extended along the second direction DR2, the transfer signal line TL_1 may include a first line TL1 extended along the first direction DR1 and a second line TL2 extended along the second direction DR2, and the output signal line VOL_1 may include a first line VOL1 extended along the first direction DR1 and a second line VOL2 extended along the second direction DR2.

The second metal layer may include the first line DCL1 of the DCG signal line DCL_1, the first line SL1 of the selection signal line SL_1, the reset signal line RL, the first line TL1 of the transfer signal line TL_1, the power supply voltage line VDDL, the second electrode CDE2_1 of the first DCG capacitor CD1_1, and the first line VOL1 of the output signal line VOL_1.

The third metal layer may include the second line DCL2 of the DCG signal line DCL_1, the second line SL2 of the selection signal line SL_1, a second line RL2 of a reset signal line RL_1, the second line TL2 of the transfer signal line TL_1, and the second line VOL2 of the output signal line VOL_1.

The second line DCL2 of the DCG signal line DCL_1 may be electrically connected to the first line DCL1 through a 16th via hole VIA16, the second line SL2 of the selection signal line SL_1 may be electrically connected to the first line SL1 through a 17th via hole VIA17, the second line TL2 of the transfer signal line TL_1 may be electrically connected to the first line TL1 through a 15th via hole VIA15, and the second line VOL2 of the output signal line VOL_1 may be electrically connected to the first line VOL1 through an 18th via hole VIA18.

In the implementations, the DCG signal line DCL_1, the selection signal line SL_1, the transfer signal line TL_1, and the power voltage line VDDL_1 are located on the second metal layer and may not physically interfere with the second electrode CDE2_1 arranged to overlap each of the first electrode unit CDE1a to the fourth electrode unit CDE1d.

The second electrode CDE2_1 may be arranged to overlap each of the first electrode unit CDE1a to the fourth electrode unit CDE1d.

As described above, the CG value may be inversely proportional to the capacitance of the floating diffusion region (see FA in FIG. 4). Therefore, as the difference between the maximum value of the capacitance of the floating diffusion region (see FA in FIG. 4) and the minimum value of the capacitance of the floating diffusion region (see FA in FIG. 4) increases, the conversion ratio of CG of the HCG mode and the LCG mode can be increased. The minimum value of the capacitance of the floating diffusion region (see FA in FIG. 4) may not change significantly. The minimum value of the capacitance of the floating diffusion region FA may be the capacitance of the floating diffusion region FA of a state where the first DCG transistor DCT1 is turned off. The maximum value of the capacitance of the floating diffusion region FA may be the capacitance of the floating diffusion region FA of a state where the first DCG transistor DCT1 is turned on. Therefore, in a state where the first DCG transistor DCT1 is turned on, as the capacitance of the first DCG capacitor CD1 added to the floating diffusion region FA increases, the maximum value of the capacitance of the floating diffusion region FA may increase. According to the pixel array 110_2 of this embodiment, the capacitance of the first DCG capacitor CD1_1 can be increased as the second electrode CDE2_1 is arranged to overlap each of the first to fourth electrode units CDE1a to CDE1d. Accordingly, the conversion ratio of CG of the HCG mode and the LCG mode can be increased. Furthermore, as a second insulating layer ILD2 having a high permittivity is arranged between the first electrode CDE1 and the second electrode CDE2_1, capacitance of the first DCG capacitor CD1_1 can be increased.

Figure 17:
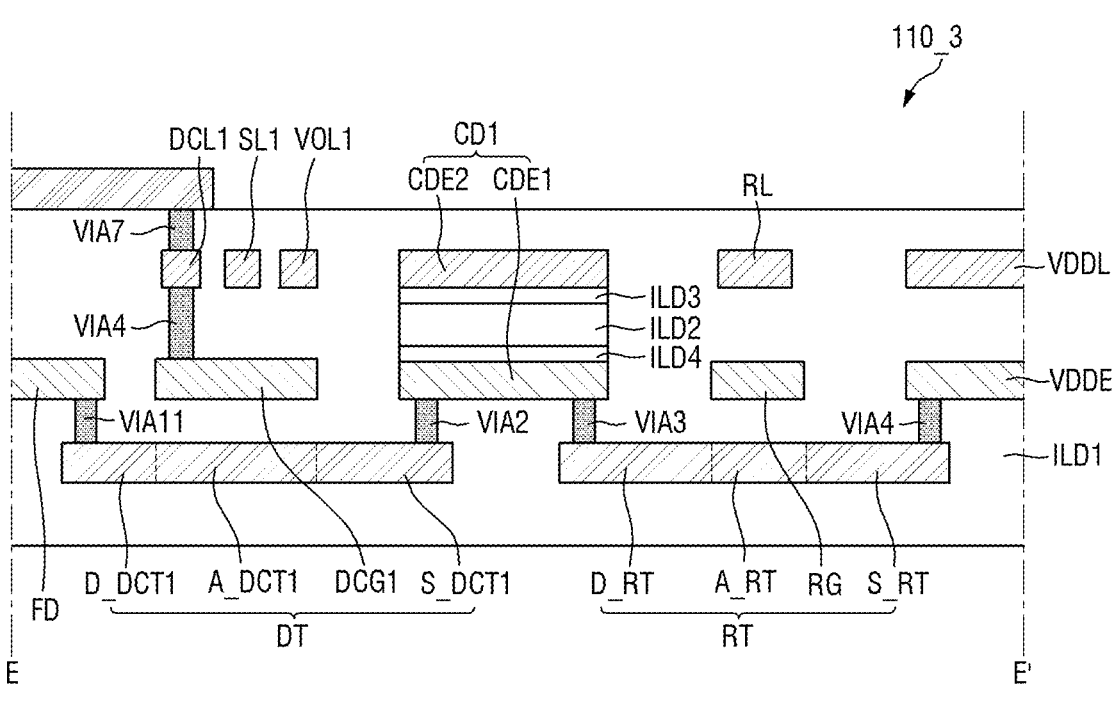
FIG. 17 is a cross-sectional view showing a pixel array according to another embodiment of the disclosed technology.

FIG. 17 is a cross-sectional view showing a pixel array according to another embodiment.

Referring to FIG. 17, the pixel array 110_3 according to this embodiment is different from the pixel array 110_2 according to FIGS. 14 to 16 in that the pixel array 110_3 further includes a third insulating layer ILD3 arranged between the second insulating layer ILD2 and the second electrode CDE2_1 and a fourth insulating layer ILD4 arranged between the first electrode CDE1 and the second insulating layer ILD2.

In the implementations, the third and fourth insulating layers ILD3 and ILD4 may function of improving adhesion between the second insulating layer ILD2 and the electrodes CDE1 and CDE2_1, respectively. For example, each of the third and fourth insulating layers ILD3 and ILD4 may include the same insulating material. In another example, the third and fourth insulating layers ILD3 and ILD4 may include different insulating materials from each other. For example, each of the third and fourth insulating layers ILD3 and ILD4 may have the permittivity that is higher than the permittivity of the first insulating layer ILD1 and lower than the permittivity of the second insulating layer ILD2. However, other implementations are also possible. For example, each of the third and fourth insulating layers ILD3 and ILD4 may include $SiO_2$. However, other implementations are also possible. Thus, each of the third and fourth insulating layers ILD3 and ILD4 may include insulating material other than $SiO_2$. While FIG. 14 shows the third and fourth insulating layers ILD3 and ILD4 are included, other implementations are also possible. For example, either the third insulating layer ILD3 or the fourth insulating layer ILD4 may be omitted.

Other descriptions are given in FIGS. 14 to 16, detailed description will be omitted below.

Figure 18:
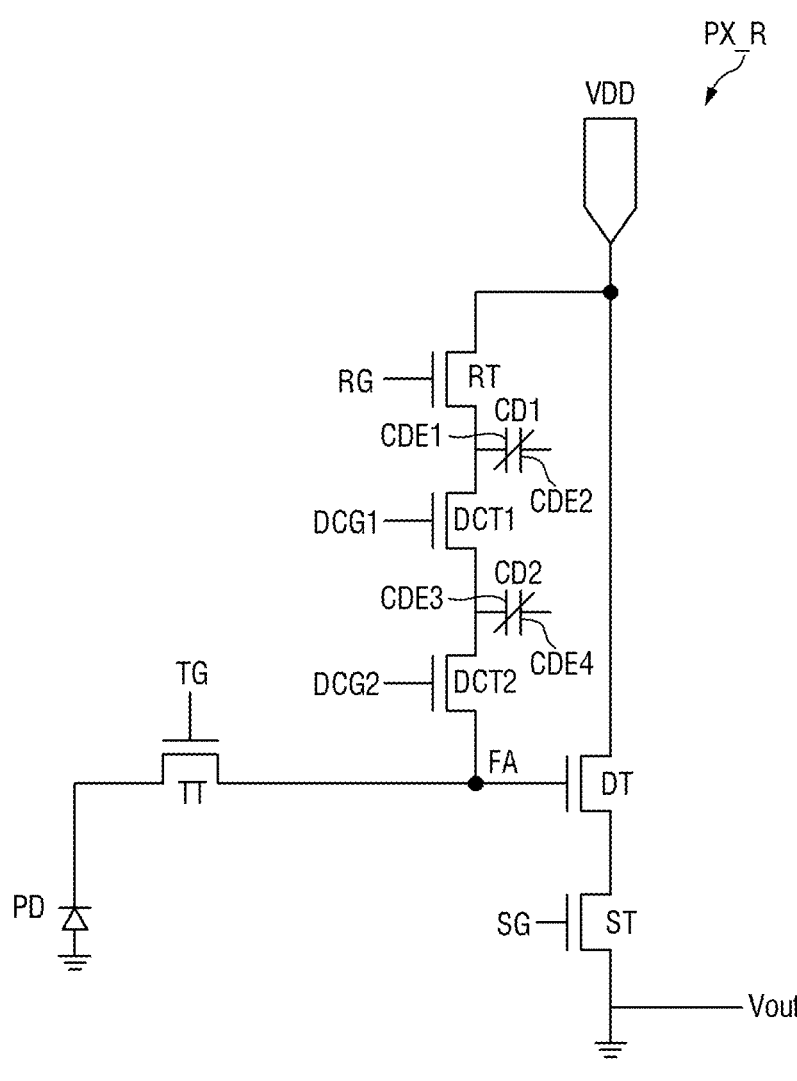
FIG. 18 is an equivalent circuit diagram showing a pixel included in a pixel array according to another embodiment of the disclosed technology.
Figure 19:
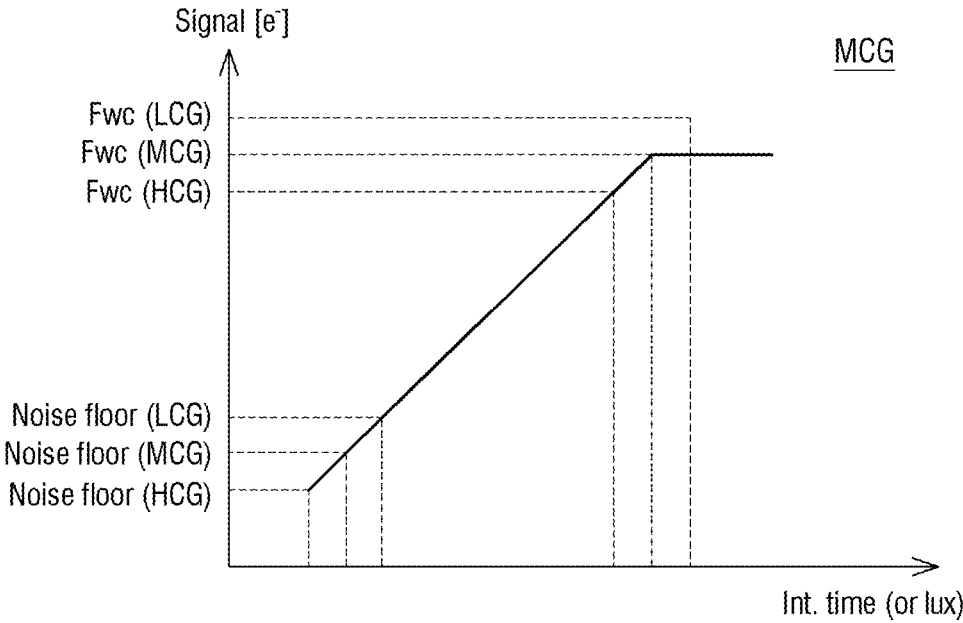
FIG. 19 is a graph showing signal strength according to time (or light amount) in the MCG mode.

FIG. 18 is an equivalent circuit diagram showing a pixel included in a pixel array according to another embodiment. FIG. 19 is a graph showing signal strength according to time (or light amount) in the MCG mode.

Referring to FIGS. 1, 2, 18 and 19, the gain processing unit 310 may determine a gain according to the conversion gain difference between the high conversion gain (HCG) mode, the low conversion gain (LCG) mode, and the middle conversion gain (MCG), and provide the gain to the image compositing unit 320. Each pixel of the pixel array may operate in any one among the HCG mode, the LCG mode, and the MCG mode, and the mode of each pixel may be determined by the strength (or illuminance) of light entering each pixel. The HCG mode may mean a mode in which a pixel has a relatively high conversion gain, the LCG mode may mean a mode in which a pixel has a relatively low conversion gain, and the MCG mode may mean a mode in which a pixel has a low conversion gain compared to the HCG mode and a high conversion gain compared to the LCG mode.

The image compositing unit 320 may synthesize an HDR image corresponding to a high dynamic range using image data of pixels operating in the HCG mode, image data of pixels operating in the LCG mode, or image data of pixels operating in the MCG mode.

In the implementations, the image compositing unit 320 may process the image data of pixels operating in the HCG mode, the image data of pixels operating in the LCG mode, or the image data of pixels operating in the MCG mode, based on the gain provided from the gain processing unit 310. By processing the image data of pixels based on the gain, the image compositing unit 320 may generate an HDR image.

The first sub-pixel PX_R operating in the LCG mode, HCG mode, or MCG mode may further include a second DCG transistor DCT2 arranged between the first DCG transistor DCT1 and the floating diffusion region FA. A DCG signal may be applied to the gate electrode DCG2 of the second DCG transistor DCT2, the source electrode may be connected to the second DCG capacitor CD2, and the drain electrode may be connected to the floating diffusion region FA. The second DCG capacitor CD2 may include a third electrode CDE3 connected to the source electrode of the second DCG transistor DCT2, and a fourth electrode CDE4.

When the floating diffusion region FA has a first capacitance, the sub-pixel PX_R may have a relatively high conversion gain. Thus, a sub-pixel in which the floating diffusion region FA has a first capacitance may be defined as a pixel operating in the HCG mode. The first capacitance may be the capacitance of the floating diffusion region FA in a state where the first DCG transistor DCT1 and the second DCG transistor DCT2 are turned off.

When the floating diffusion region FA has a third capacitance, the sub-pixel PX_R may have a relatively high conversion gain compared to when it has a first capacitance. That is, a pixel in which the floating diffusion region FA has a third capacitance may be defined as a pixel operating in the MCG mode. The third capacitance may be the capacitance of the floating diffusion region FA in a state where either the first DCG transistor DCT1 or the second DCG transistor DCT2 is turned on. The third capacitance may be higher than the first capacitance. The difference between the third capacitance and the first capacitance may be equal to the sum of the parasitic capacitance of the first DCG transistor DCT1 and the capacitance of the first DCG capacitor CD1, or the sum of the parasitic capacitance of the second DCG transistor DCT2 and the capacitances of the second DCG capacitor CD2.

When the floating diffusion region FA has a second capacitance, the sub-pixel PX_R may have a relatively low conversion gain compared to when it has a third capacitance. That is, a pixel in which the floating diffusion region FA has a second capacitance may be defined as a pixel operating in the MCG mode. The second capacitance may be the capacitance of the floating diffusion region FA in a state where the first DCG transistor DCT1 and the second DCG transistor DCT2 are turned on. The second capacitance may be higher than the third capacitance. The difference between the second capacitance and the first capacitance may be equal to the sum of the parasitic capacitance of the first DCG transistor DCT1, the capacitance of the first DCG capacitor CD1, the parasitic capacitance of the second DCG transistor DCT2, and the capacitances of the second DCG capacitor CD2.

As shown in FIG. 19, the noise floor and full well capacity Fwc in each of the LCG mode, HCG mode, and MCG mode are displayed on the vertical axis. The noise floor in the MCG mode may be located between the noise floor in the LCG mode and the noise floor in the HCG mode.

As described above, as the capacitance of the floating diffusion region (see FA in FIG. 4) in the MCG mode may have an intermediate value of the capacitance of the floating diffusion region (see FA in FIG. 4) in the LCG mode and the capacitance of the floating diffusion region (see FA in FIG. 4) in the HCG mode, the full well capacity Fwc, which is the maximum capacitance that can be charged in the floating diffusion region (see FA in FIG. 4) to the maximum, may be higher than that of the LCG mode and lower than that of the HCG mode. For example, the conversion ratio of CG of the LCG mode, the MCG mode, and the HCG mode may be the ratio between the CG value in the LCG mode, the CG value in the MCG mode, and the CG value in the HCG mode. As described above, the CG value may be inversely proportional to the capacitance of the floating diffusion region (see FA in FIG. 4). Therefore, the conversion ratio of CG of the LCG mode, the MCG mode, and the HCG mode may be determined based on the difference between the first capacitance and the third capacitance, and the difference between the third capacitance and the second capacitance. As described above, the first capacitance may be the capacitance of the floating diffusion region FA in a state where the first DCG transistor DCT1 and the second DCG transistor DCT2 are turned off. The difference between the third capacitance and the first capacitance may be equal to the sum of the parasitic capacitance of the first DCG transistor DCT1 and the capacitance of the first DCG capacitor CD1, or the sum of the parasitic capacitance of the second DCG transistor DCT2 and the capacitances of the second DCG capacitor CD2. The difference between the second capacitance and the first capacitance may be equal to the sum of the parasitic capacitance of the first DCG transistor DCT1, the capacitance of the first DCG capacitor CD1, the parasitic capacitance of the second DCG transistor DCT2, and the capacitances of the second DCG capacitor CD2. Therefore, as the capacitance of the first DCG capacitor CD1 and the capacitance of the second DCG capacitor CD2 increase, the conversion ratio of CG of the LCG mode, the MCG mode, and the HCG mode may increase.

In this embodiment, a second insulating layer (see ILD2 in FIG. 12) may be arranged between the third electrode CDE3 and the fourth electrode CDE4 of the second DCG capacitor CD2. As the second insulating layer (see ILD2 in FIG. 12) having a high permittivity is arranged between the third electrode CDE3 and the fourth electrode CDE4, the capacitance of the second DCG capacitor CD2 may be increased. Accordingly, the conversion ratio of CG of the HCG mode, the MCG mode, and the LCG mode may be increased. For example, although the permittivity of the second insulating layer ILD2 is higher than the permittivity of the first insulating layer ILD1, and the permittivity of the second insulating layer ILD2 may be about 10 or higher, the embodiments of the present specification are not limited thereto. For example, the second insulating layer ILD2 may include $HfO_2$, $ZrO_2$, or $Al_2O_3$. However, other implementations are also possible while being not limited thereto.

Figure 20:
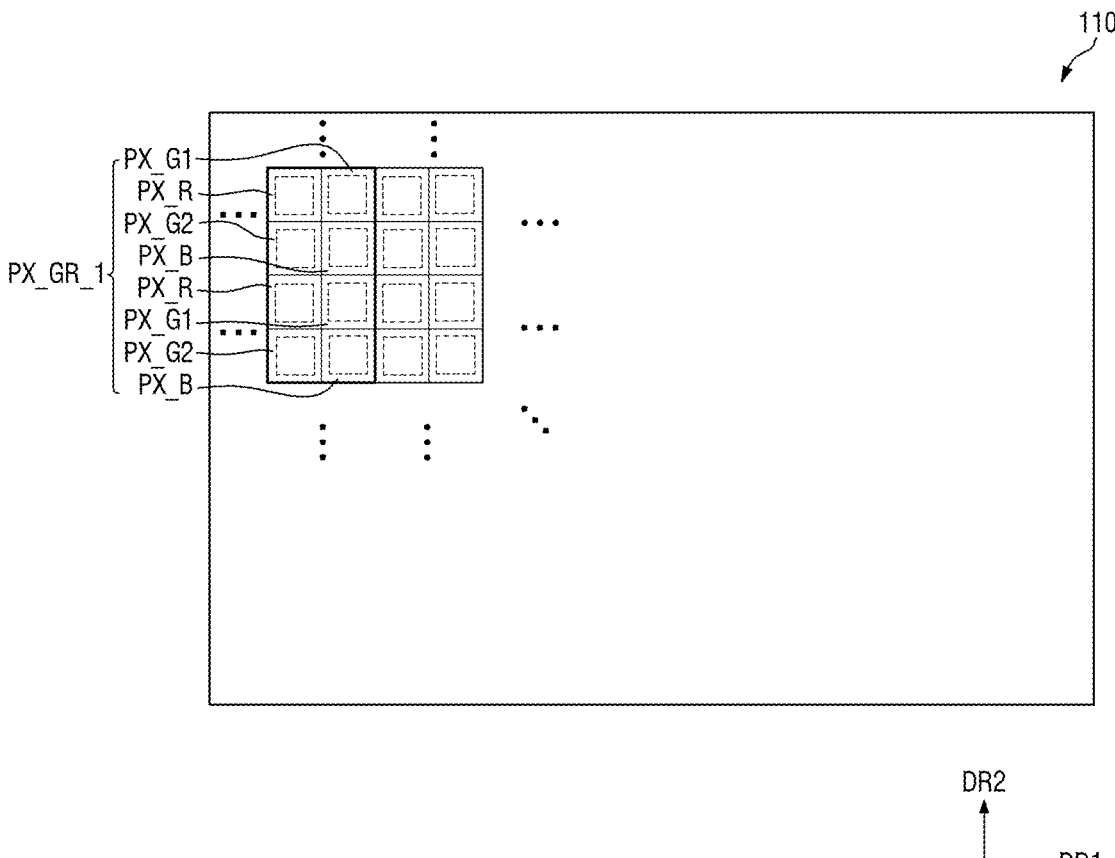
FIG. 20 is a schematic plan view showing a pixel array according to another embodiment of the disclosed technology.
Figure 21:
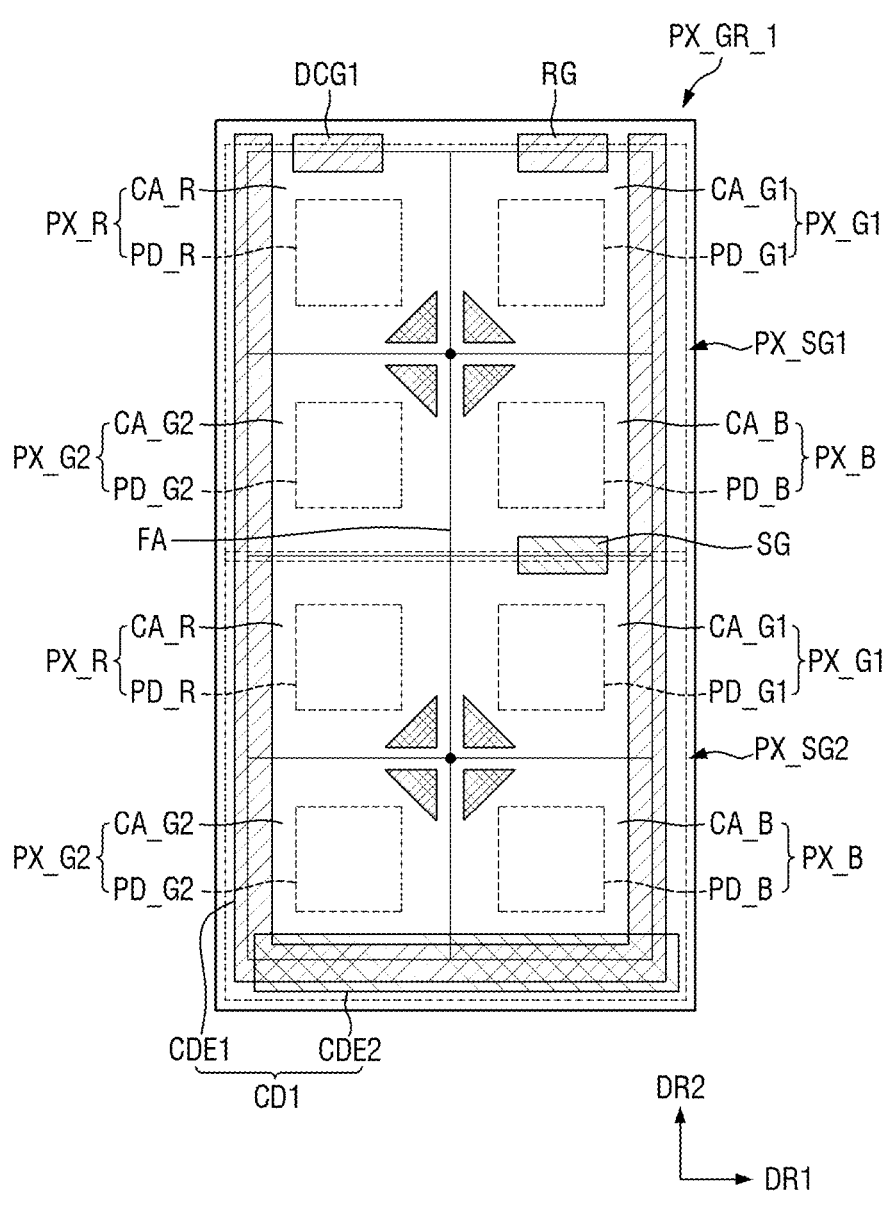
FIG. 21 is a detailed plan view showing a pixel array according to another embodiment of the disclosed technology.
Figure 22:
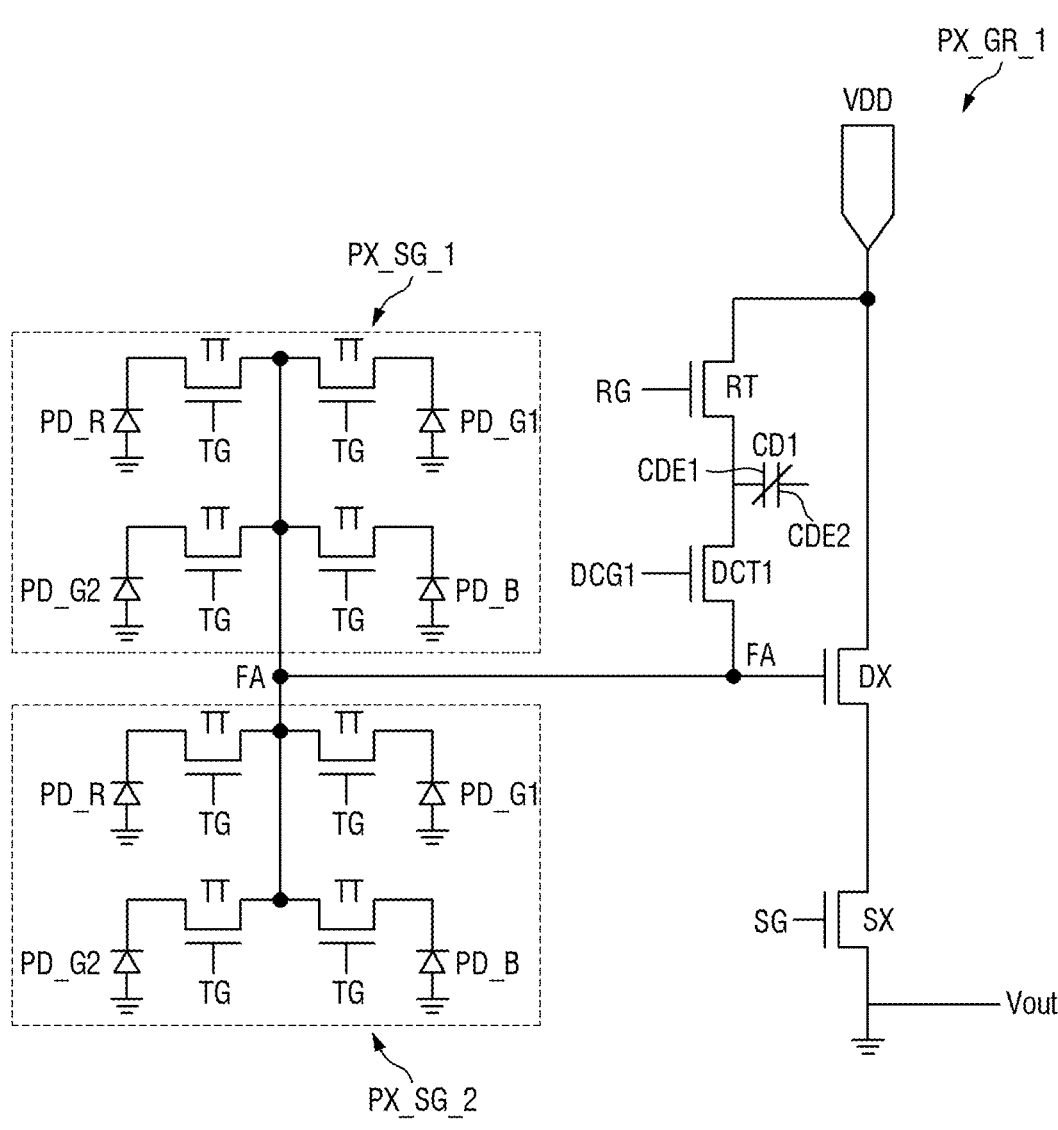
FIG. 22 is an equivalent circuit diagram showing pixels included in the pixel array of FIG. 21.

FIG. 20 is a schematic plan view showing a pixel array according to another embodiment. FIG. 21 is a detailed plan view showing a pixel array according to another embodiment. FIG. 22 is an equivalent circuit diagram showing pixels included in the pixel array of FIG. 21.

Referring to FIGS. 20 to 22, the pixel array according to this embodiment may include a pixel group PX_GR_1. The pixel groups PX_GR_1 may be provided in plurality, and the plurality of pixel groups PX_GR_1 may be arranged in a first direction DR1 and a second direction DR2 intersecting the first direction DR1.

Two pixel groups PX_GR adjacent in the second direction DR2 as shown in FIG. 3 may form one pixel group PX_GR_1. All sub-pixels constituting one pixel group PX_GR_1 may share a floating diffusion region FA. For example, the pixel group PX_GR_1 may include a first sub-pixel group PX_SG1 located on one side in the second direction DR2, and a second sub-pixel group PX_SG2 located on the other side in the second direction DR2. The sub-pixels PX_R, PX_G1, PX_G2, and PX_B in the first sub-pixel group PX_SG1 may share a floating diffusion region FA with each other, the sub-pixels PX_R, PX_G1, PX_G2, and PX_B in the second sub-pixel group PX_SG2 may share a floating diffusion region FA with each other, and the first sub-pixel group PX_SG1 and the second sub-pixel group PX_SG2 may share a floating diffusion region FA with each other.

The pixel array has the advantage of expanding the area of the photodiode region and reducing the area of the circuit region by arranging sub-pixels in each pixel group PX_GR_1.

As shown in FIG. 21, the sub-pixels PX_R, PX_G1, PX_G2, and PX_B located on one side in the second direction DR2 may share a floating diffusion region FA with each other, and the sub-pixels PX_R, PX_G1, PX_G2, and PX_B located on the other side in the second direction DR2 may share a floating diffusion region FA with each other. Furthermore, the floating diffusion region FA of the sub-pixels PX_R, PX_G1, PX_G2, and PX_B located on one side in the second direction DR2 and the floating diffusion region FA of the sub-pixels PX_R, PX_G1, PX_G2, and PX_B located on the other side in the second direction DR2 may be electrically connected to each other.

For example, the gate electrode DCG1 of the first DCG transistor DCT1 may be located on one side in the second direction DR2 of the first sub-pixel group PX_SG1, the gate electrode RG of the reset transistor RT may be located on one side in the second direction DR2 of the first sub-pixel group PX_SG1, and the gate electrode SG of the selection transistor ST may be located between the first sub-pixel group PX_SG1 and the second sub-pixel group PX_SG2. The gate electrode TG of the transfer transistor TT may be arranged in the circuit regions CA_R, CA_G1, CA_G2, and CA_B of the sub-pixels PX_R, PX_G1, PX_G2, and PX_B.

The first electrode CDE1 may be arranged to be extended along the right edge, bottom edge, and left edge of the pixel group PX_GR_1. The second electrode CDE2 may be arranged to overlap the first electrode CDE1 located at the bottom edge of the pixel group PX_GR_1.

According to the imaging device of this embodiment, as the sub-pixels PX_R, PX_G1, PX_G2, and PX_B in the first sub-pixel group PX_SG1 share the floating diffusion region FA with each other, the sub-pixels PX_R, PX_G1, PX_G2, and PX_B in the second sub-pixel group PX_SG2 share the floating diffusion region FA with each other, and the first sub-pixel group PX_SG and the second sub-pixel group PX_SG2 share the floating diffusion region FA with each other, the capacitance of the floating diffusion region FA may be increased. According thereto, the conversion ratio of CG of the HCG mode and the LCG mode can be increased.

In addition, as shown in FIG. 12, a second insulating layer ILD2 having a high permittivity may be arranged between the first electrode CDE1 and the second electrode CDE2. According thereto, the capacitance of the first DCG capacitor CD1 can be increased. According thereto, the conversion ratio of CG of the HCG mode and the LCG mode can be increased.

For example, although the permittivity of the second insulating layer ILD2 is higher than the permittivity of the first insulating layer ILD1, and the permittivity of the second insulating layer ILD2 may be about 10 or higher, the embodiments of the present specification are not limited thereto. For example, although the second insulating layer ILD2 may include $HfO_2$, $ZrO_2$, or $Al_2O_3$, the embodiments of the present specification are not limited thereto.

Even in the case of the embodiment according to FIGS. 20 to 22, the second DCG transistor DCT2 and the second DCG capacitor CD2 described in FIG. 18 may be additionally applied. In addition, even in the case of the embodiment according to FIGS. 20 to 22, the third and fourth insulating layers ILD3 and ILD4 described in FIG. 13 may be additionally applied.

Figure 23:
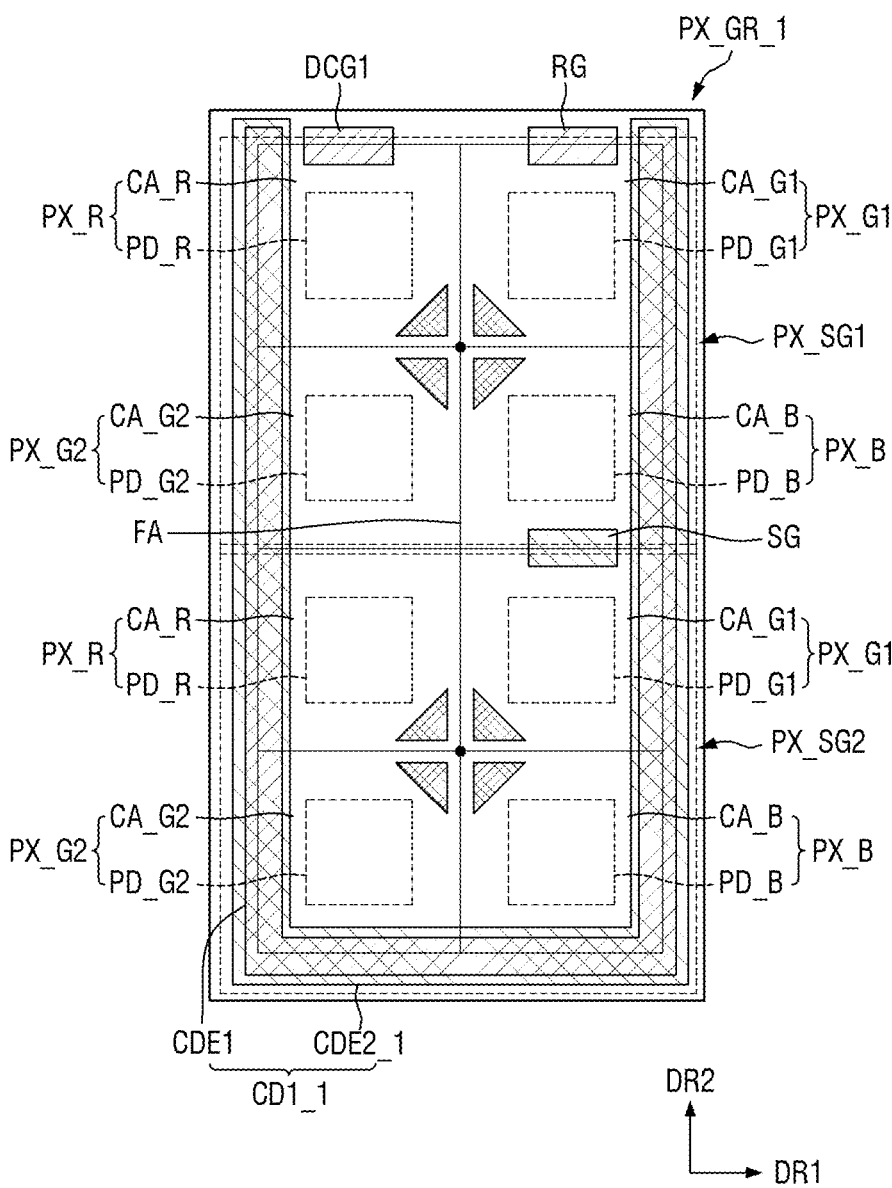
FIG. 23 is a detailed plan view showing a pixel array according to another embodiment of the disclosed technology.

FIG. 23 is a detailed plan view showing a pixel array according to another embodiment.

Referring to FIG. 23, the second electrode CDE2_1 of the first DCG capacitor CD1_1 of the pixel array according to this embodiment is arranged to be extended along the right edge, bottom edge, and left edge of the pixel group PX_GR_1, and it is different from the pixel array according to FIG. 21 in that it is arranged to overlap the first electrode CDE1 at the right edge, bottom edge, and left edge of the pixel group PX_GR_1.

According to the pixel array of this embodiment, as the second electrode CDE2_1 is arranged to overlap the first electrode CDE1 at the right edge, bottom edge, and left edge of the pixel group PX_GR_1, the capacitance of the first DCG capacitor CD1_1 can be increased. According thereto, the conversion ratio of CG of the HCG mode and the LCG mode can be increased. In addition, as a second insulating layer (see ILD2 of FIG. 12) having a high permittivity is arranged between the first electrode CDE1 and the second electrode CDE2_1, the capacitance of the first DCG capacitor CD1_1 can be increased.

Figure 24:
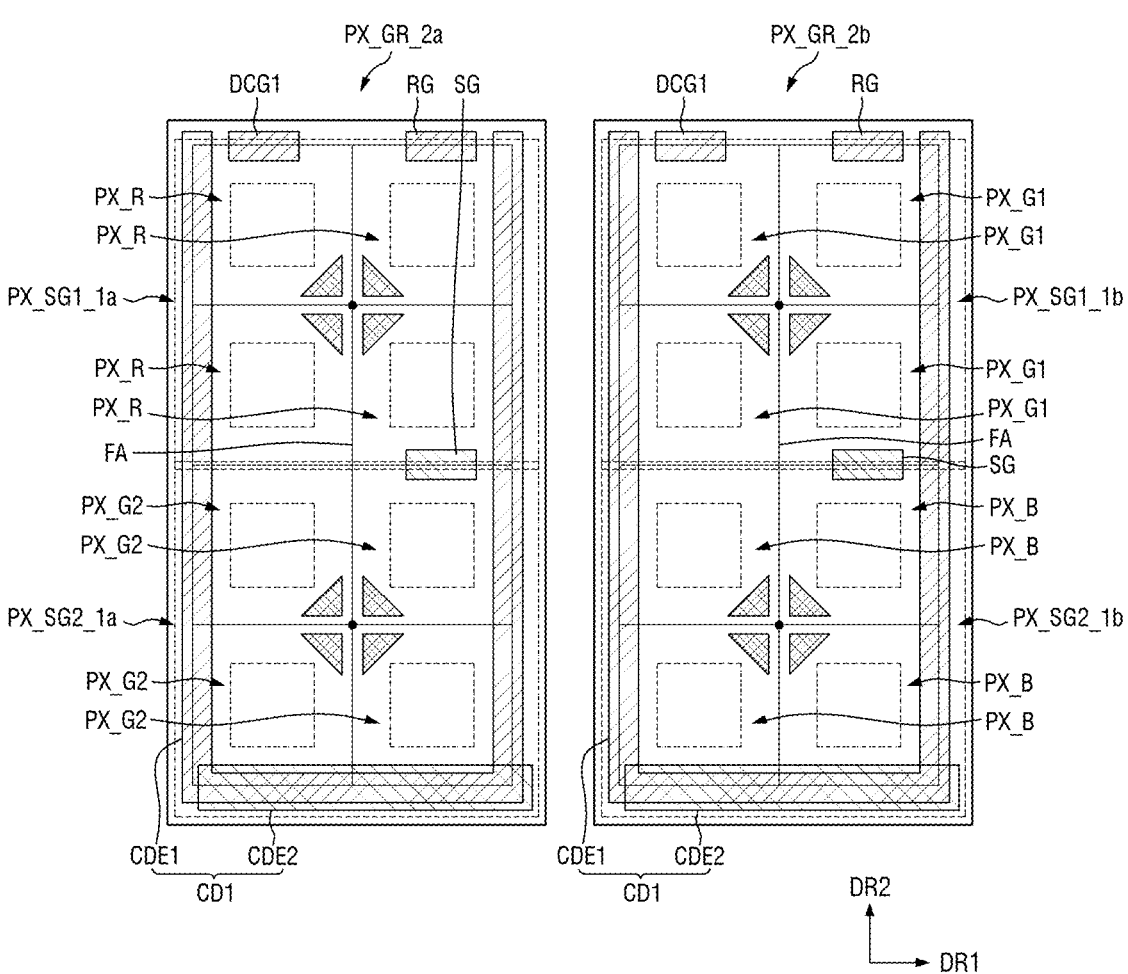
FIG. 24 is a detailed plan view showing a pixel array according to another embodiment of the disclosed technology.

FIG. 24 is a detailed plan view showing a pixel array according to another embodiment.

Referring to FIG. 24, the pixel array according to this embodiment may include a first pixel group PX_GR_2a and a second pixel group PX_GR_2b. The first pixel group PX_GR_2a may be repeatedly arranged along the second direction DR2, the second pixel group PX_GR_2b may be repeatedly arranged along the second direction DR2, and the first pixel group PX_GR_2a and the second pixel group PX_GR_2b may be alternately arranged along the first direction DR1.

All sub-pixels constituting one pixel group PX_GR_2a or PX_GR_2b may share a floating diffusion region FA.

For example, the first pixel group PX_GR_2a may include a first sub-pixel group PX_SG1_1a located on one side in the second direction DR2, and a second sub-pixel group PX_SG2_1a located on the other side in the second direction DR2.

The first sub-pixel group PX_SG1_1a may be configured of only four first sub-pixels PX_R. The second sub-pixel group PX_SG2_1a may be configured of only four third sub-pixels PX_G2.

The four first sub-pixels PX_R in the first sub-pixel group PX_SG1_1a may share a floating diffusion region FA with each other, and the four third sub-pixels PX_G2 in the second sub-pixel group PX_SG2_1a may share a floating diffusion region FA with each other.

The first sub-pixel group PX_SG1_1a and the second sub-pixel group PX_SG2_1a may share a floating diffusion region FA.

The second pixel group PX_GR_2b may include a first sub-pixel group PX_SG1_1b located on one side in the second direction DR2, and a second sub-pixel group PX_SG2_1b located on the other side in the second direction DR2.

The first sub-pixel group PX_SG1_1b may be configured of only four second sub-pixels PX_G1. The second sub-pixel group PX_SG2_1b may be configured of only four fourth sub-pixels PX_B.

The four second sub-pixels PX_G1 in the first sub-pixel group PX_SG1_1b may share a floating diffusion region FA with each other, and the four fourth sub-pixels PX_B in the second sub-pixel group PX_SG2_1b may share a floating diffusion region FA with each other.

The first sub-pixel group PX_SG1_1b and the second sub-pixel group PX_SG2_1b may share a floating diffusion region FA.

The pixel array has the advantage of expanding the area of the photodiode region and reducing the area of the circuit region by arranging sub-pixels in each pixel group PX_GR_2.

For example, the gate electrode DCG1 of the first DCG transistor DCT1 may be located on one side in the second direction DR2 of each of the first sub-pixel groups PX_SG1_1a and PX_SG1_1b, the gate electrode RG of the reset transistor RT may be located on one side in the second direction DR2 of each of the first sub-pixel groups PX_SG1_1a and PX_SG1_1b, and the gate electrode SG of the selection transistor ST may be located between each of the first sub-pixel groups PX_SG1_1a and PX_SG1_1b and each of the second sub-pixel groups PX_SG2_1a and PX_SG2_1b. The gate electrode TG of the transfer transistor TT may be arranged in the circuit regions CA_R, CA_G1, CA_G2, and CA_B of the sub-pixels PX_R, PX_G1, PX_G2, and PX_B.

The first electrode CDE1 may be arranged to be extended along the right edge, bottom edge, and left edge of each of the pixel groups PX_GR_2a and PX_GR_2b. The second electrode CDE2 may be arranged to overlap the first electrode CDE1 located at the bottom edge of each of the pixel groups PX_GR_2a and PX_GR_2b.

According to the imaging device of this embodiment, the four first sub-pixels PX_R in the first sub-pixel group PX_SG1_1a may share a floating diffusion region FA with each other, the four third sub-pixels PX_G2 in the second sub-pixel group PX_SG2_1a may share a floating diffusion region FA with each other, and the first sub-pixel group PX_SG1_1a and the second sub-pixel group PX_SG2_1a may share a floating diffusion region FA with each other. In addition, the four second sub-pixels PX_G1 in the first sub-pixel group PX_SG1_1b may share a floating diffusion region FA with each other, the four fourth sub-pixels PX_B in the second sub-pixel group PX_SG2_1b may share a floating diffusion region FA with each other, and the first sub-pixel group PX_SG1_1b and the second sub-pixel group PX_SG2_1b may share a floating diffusion region FA with each other. According thereto, the conversion ratio of CG of the HCG mode and the LCG mode can be increased.

In addition, as shown in FIG. 12, a second insulating layer ILD2 having a high permittivity may be arranged between the first electrode CDE1 and the second electrode CDE2. According thereto, the capacitance of the first DCG capacitor CD1 can be increased. According thereto, the conversion ratio of CG of the HCG mode and the LCG mode can be increased.

For example, although the permittivity of the second insulating layer ILD2 is higher than the permittivity of the first insulating layer ILD1, and the permittivity of the second insulating layer ILD2 may be about 10 or higher, the embodiments of the present specification are not limited thereto. For example, although the second insulating layer ILD2 may include $HfO_2$, $ZrO_2$, or $Al_2O_3$, the embodiments of the present specification are not limited thereto.

Even in the case of the embodiment according to FIG. 24, the second DCG transistor DCT2 and the second DCG capacitor CD2 described in FIG. 18 may be additionally applied. In addition, even in the case of the embodiment according to FIG. 24, the third and fourth insulating layers ILD3 and ILD4 described in FIG. 13 may be additionally applied.

Figure 25:
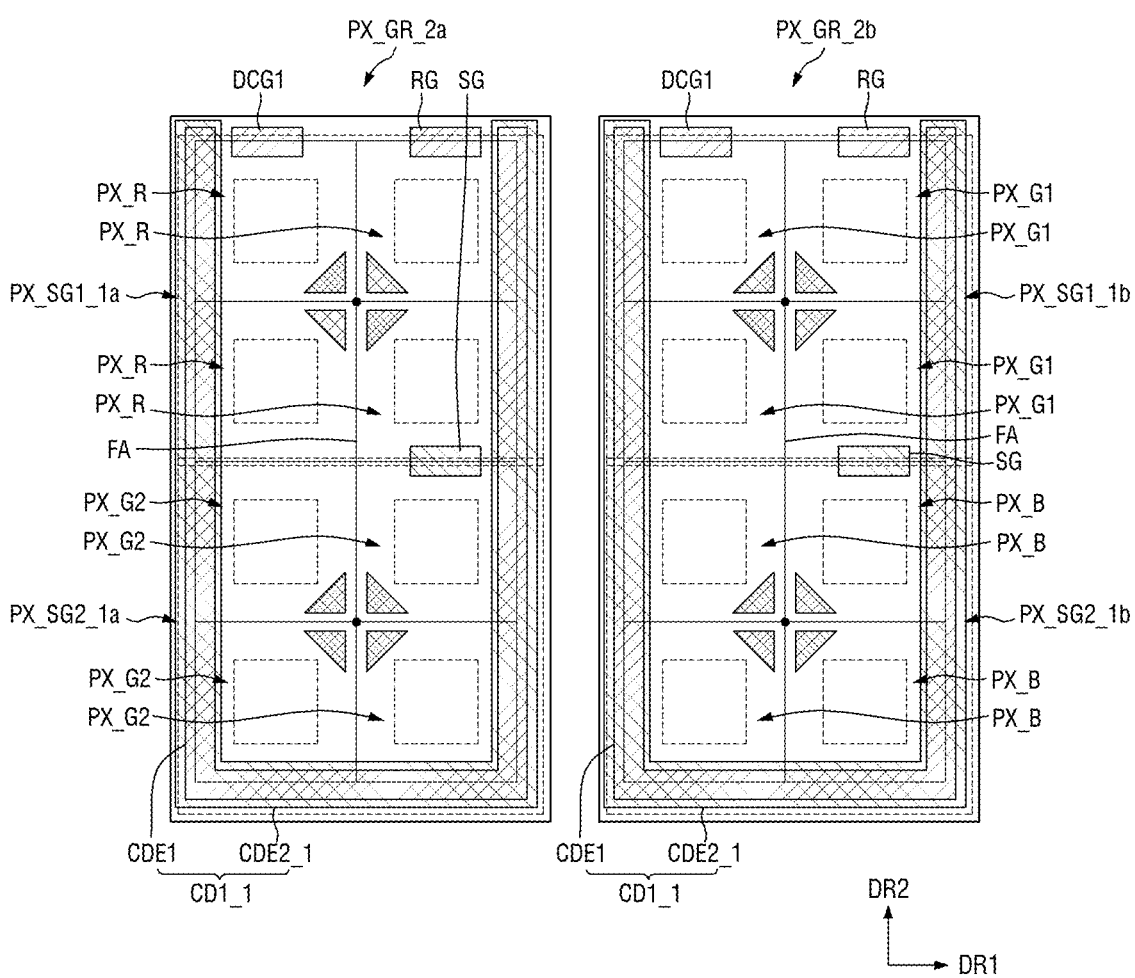
FIG. 25 is a detailed plan view showing a pixel array according to another embodiment of the disclosed technology.

FIG. 25 is a detailed plan view showing a pixel array according to another embodiment.

Referring to FIG. 25, the second electrode CDE2_1 of the first DCG capacitor CD1_1 of the pixel array according to this embodiment is arranged to be extended along the right edge, bottom edge, and left edge of the pixel groups PX_GR_2a and PX_GR_2b, and it is different from the pixel array according to FIG. 24 in that it is arranged to overlap the first electrode CDE1 at the right edge, bottom edge, and left edge of the pixel groups PX_GR_2a and PX_GR_2b.

According to the pixel array of this embodiment, as the second electrode CDE2_1 is arranged to be extended along the right edge, bottom edge, and left edge of the pixel groups PX_GR_2a and PX_GR_2b and arranged to overlap the first electrode CDE1 at the right edge, bottom edge, and left edge of the pixel groups PX_GR_2a and PX_GR_2b, the capacitance of the first DCG capacitor CD1_1 can be increased. According thereto, the conversion ratio of CG of the HCG mode and the LCG mode can be increased. In addition, as a second insulating layer (see ILD2 of FIG. 12) having a high permittivity is arranged between the first electrode CDE1 and the second electrode CDE2_1, the capacitance of the first DCG capacitor CD1_1 can be increased.

An imaging device according to various embodiments of the present specification may be described as follows.

An imaging device according to various embodiments of the present specification includes: a pixel including a photoelectric conversion device for generating pixel signals each having a size corresponding to illuminance and generating photo charges corresponding to the illuminance, a floating diffusion region for accumulating the generated photo charges, a first dual conversion gain (DCG) transistor for providing additional capacitance to the floating diffusion region, and a first DCG capacitor connected to the floating diffusion region through the first DCG transistor; and an analog-digital converter (ADC) for converting the pixel signals into image data, wherein the pixel includes a first metal layer including a first DCG gate electrode of the first DCG transistor and a first electrode of the first DCG capacitor, a second metal layer including a dual conversion line that supplies a first DCG gate signal to the first DCG gate electrode on the first metal layer, and a second electrode overlapping the first electrode, a first insulating layer between the first DCG gate electrode and the dual conversion line, and a second insulating layer between the first electrode and the second electrode, wherein a permittivity of the second insulating layer is higher than a permittivity of the first insulating layer.

In the imaging device according to various embodiments of the present specification, the source electrode of the first DCG transistor may be connected to the first electrode, and the drain electrode of the first DCG transistor may be connected to the floating diffusion region.

In the imaging device according to various embodiments of the present specification, the additional capacitance provided to the floating diffusion region may correspond to the sum of the parasitic capacitance of the first DCG transistor and the capacitance of the first DCG capacitor.

In the imaging device according to various embodiments of the present specification, the capacitance of the floating diffusion region in a state where the first DCG transistor is turned on may be higher than the capacitance of the floating diffusion region in a state where the first DCG transistor is turned off.

The imaging device according to various embodiments of the present specification may further include an image signal processor for generating a high dynamic range (HDR) image using the image data.

In the imaging device according to various embodiments of the present specification, the image signal processor may determine a gain for image data generated in the low conversion gain (LCG) mode in which the additional capacitance is provided to the floating diffusion region, and image data generated in the high conversion gain (HCG) mode in which the additional capacitance is not provided to the floating diffusion region.

The imaging device according to various embodiments of the present specification may further include a second DCG transistor connected to the first DCG capacitor, and a second DCG capacitor connected to the source electrode of the second DCG transistor, and the image signal processor may determine a gain for image data generated in the LCG mode in which the additional capacitance is provided by the first DCG transistor, the first DCG capacitor, the second DCG transistor, and the second DCG capacitor, image data generated in the MCG mode in which the additional capacitance is provided by the first DCG transistor and the first DCG capacitor, and image data generated in the HCG mode in which the additional capacitance is not provided.

In the imaging device according to various embodiments of the present specification, the first metal layer may further include a third electrode of the second DCG capacitor, the second metal layer may further include a fourth electrode of the second DCG capacitor, and the second insulating layer may be further arranged between the third electrode and the fourth electrode.

In the imaging device according to various embodiments of the present specification, the first insulating layer may include SiCOH, and the second insulating layer may include $HfO_2$, $ZrO_2$, or $Al_2O_3$.

In the imaging device according to various embodiments of the present specification, the permittivity of the second insulating layer may be 10 or higher.

The imaging device according to various embodiments of the present specification may further include a third insulating layer arranged between the second insulating layer and the first electrode or between the second insulating layer and the second electrode, and permittivity of the third insulating layer may be higher than the permittivity of the first insulating layer and lower than the permittivity of the second insulating layer.

In the imaging device according to various embodiments of the present specification, the third insulating layer may include $SiO_2$.

In the imaging device according to various embodiments of the present specification, the pixel may further include a reset transistor between the power supply voltage and the first DCG transistor, and the reset transistor may reset the voltage of the floating diffusion region to the power supply voltage in response to a pixel reset signal.

In the imaging device according to various embodiments of the present specification, the pixel may further include a driver transistor, of which the source electrode is connected to the power supply voltage, and the gate electrode is connected to the floating diffusion region, and a selection transistor between the driver transistor and the output signal line. The driver transistor may amplify changes in the electrical potential of the floating diffusion region that receives the photo charges accumulated in the photoelectric conversion device and transmit the changes in the electrical potential to the selection transistor, and the selection transistor may be turned on by a row selection signal and output the electrical signal transferred from the driver transistor as a pixel signal through the output signal line.

The imaging device according to various embodiments of the present specification may further include a transfer transistor between the photoelectric conversion device and the floating diffusion region, and the transfer transistor may transfer photo charges accumulated in the photoelectric conversion device to the floating diffusion region in response to a transfer signal.

The imaging device according to various embodiments of the present specification may include a first metal layer including a floating diffusion electrode of a floating diffusion region that accumulates photo charges generated by the photoelectric conversion device, a gate electrode of a DCG transistor that provides additional capacitance to the floating diffusion region, and a first electrode of a first DCG capacitor connected to the source electrode of the DCG transistor and surrounding the floating diffusion electrode; a second metal layer arranged on the first metal layer and including a dual conversion line for supplying a DCG gate signal, and a second electrode of the first DCG capacitor overlapping the first electrode; a first insulating layer between the first DCG gate electrode and the dual conversion line; and a second insulating layer between the first electrode and the second electrode, and permittivity of the second insulating layer may be higher than the permittivity of the first insulating layer.

In the imaging device according to various embodiments of the present specification, the first electrode may include a first electrode unit extended along a first direction, a second electrode unit connected to the first electrode unit and extended along a second direction intersecting the first direction, a third electrode unit connected to the second electrode unit and extended along the first direction, and a fourth electrode unit connected to the third electrode unit and extended along the second direction, and the second electrode may overlap the first electrode unit and the third electrode unit.

In the imaging device according to various embodiments of the present specification, the first electrode unit and the fourth electrode unit may be spaced apart from each other.

In the imaging device according to various embodiments of the present specification, the second electrode may overlap the first to fourth electrode units.

The imaging device according to various embodiments of the present specification may further include a third metal layer on the second metal layer, and the dual conversion line may include a first dual conversion line arranged on the second metal layer and extended along the first direction, and a second dual conversion line arranged on the third metal layer, electrically connected to the first dual conversion line, and extended along the second direction.

Although the embodiments are described above with reference to the accompanying drawings, those skilled in the art may understand that the technical configurations may be implemented in other specific forms. Therefore, the embodiments described above should be understood in all respects as illustrative and not restrictive. In addition, the meaning and scope of the patent claims and all changes or modified forms derived from the equivalent concept should be construed as being included in the scope.

According to the embodiments, additional capacitance may be provided to the floating diffusion region through the DCG transistor and the DCG capacitor connected to the DCG transistor. According thereto, the conversion ratio of Conversion Gain (CG) can be increased.

According to the embodiments, the imaging device may further include a second DCG transistor connected to the first DCG capacitor, and a second DCG capacitor connected to the source electrode of the second DCG transistor, and the imaging device may separately operate in the LCG mode, MCG mode, and HCG mode by controlling the first and second DCG transistors.

According to the embodiments, the capacitance of the DCG capacitor can be increased by arranging a second insulating layer having a high permittivity between the first electrode and the second electrode of the DCG capacitor.

According to the embodiments, adhesion between the second insulating layer and the first electrode or between the second insulating layer the second electrodes can be improved by additionally arranging a third insulating layer between the second insulating layer and the first electrode or between the second insulating layer and the second electrode.

According to the embodiments, as the first electrode includes first to fourth electrode units, and the second electrode is arranged to overlap the first to fourth electrode units, respectively, capacitance of the DCG capacitor can be increased.

The effects that can be obtained from the implementations of the disclosed technology are not limited to those mentioned above, and those skilled in the art may clearly understand unmentioned other effects from the description.

The embodiments and implementations disclosed above are examples of the disclosed technology, and thus various enhancements and variations to the disclosed embodiments and implementations and other embodiments and implementations can be made for implementing the disclosed technology based on what is described and illustrated in this patent document.

What is claimed is:

1. An imaging device comprising:

a pixel region including a photoelectric conversion device configured to generate photocharges corresponding to an illuminance of an incident light at the photoelectric conversion device and produce a pixel signal representative of the generated photocharges, a floating diffusion region configured to receive and accumulate the generated photocharges from the photoelectric conversion device, a first dual conversion gain (DCG) transistor coupled to the floating diffusion region to provide an additional capacitance to the floating diffusion region, and a first DCG capacitor connected to the floating diffusion region through the first DCG transistor; and an analog-digital converter (ADC) coupled to configured to the pixel region to receive the pixel signal from the pixel region and convert the pixel signal into image data, wherein the pixel region includes:

a first metal layer including a first DCG gate electrode of the first DCG transistor and a first electrode of the first DCG capacitor;

a second metal layer including a dual conversion line that supplies a first DCG gate signal to the first DCG gate electrode on the first metal layer, and a second electrode overlapping the first electrode;

a first insulating layer disposed between the first DCG gate electrode and the dual conversion line; and a second insulating layer disposed between the first electrode and the second electrode, wherein a permittivity of the second insulating layer is higher than a permittivity of the first insulating layer.

2. The imaging device according to claim 1, wherein the first DCG transistor has a source electrode connected to the first electrode, and a drain electrode connected to the floating diffusion region.

3. The imaging device according to claim 1, wherein the additional capacitance provided to the floating diffusion region corresponds to a sum of a parasitic capacitance of the first DCG transistor and the capacitance of the first DCG capacitor.

4. The imaging device according to claim 3, wherein the capacitance of the floating diffusion region in a state where the first DCG transistor is turned on is higher than the capacitance of the floating diffusion region in a state where the first DCG transistor is turned off.

5. The imaging device according to claim 3, further comprising an image signal processor for generating a high dynamic range (HDR) image based on the image data.

6. The imaging device according to claim 5, wherein the image signal processor is configured to determine gains to process image data generated in a low conversion gain (LCG) mode in which the additional capacitance is provided to the floating diffusion region, and image data generated in a high conversion gain (HCG) mode in which the additional capacitance is not provided to the floating diffusion region.

7. The imaging device according to claim 6, further comprising a second DCG transistor connected to the first DCG capacitor, and a second DCG capacitor connected to a source electrode of the second DCG transistor, and wherein the image signal processor is further configured to determine a gain to process image data generated in an MCG mode in which the additional capacitance is provided by the first DCG transistor and the first DCG capacitor.

8. The imaging device according to claim 7, wherein the first metal layer further includes a third electrode of the second DCG capacitor, the second metal layer further includes a fourth electrode of the second DCG capacitor, and the second insulating layer is further arranged between the third electrode and the fourth electrode.

9. The imaging device according to claim 1, wherein the first insulating layer includes SiCOH, and the second insulating layer includes at least one of $HfO_2$, $ZrO_2$, or $Al_2O_3$.

10. The imaging device according to claim 1, wherein the permittivity of the second insulating layer is 10 or higher.

11. The imaging device according to claim 1, further comprising a third insulating layer arranged between the second insulating layer and the first electrode or between the second insulating layer and the second electrode, wherein a permittivity of the third insulating layer is higher than the permittivity of the first insulating layer and lower than the permittivity of the second insulating layer.

12. The imaging device according to claim 11, wherein the third insulating layer includes $SiO_2$.

13. The imaging device according to claim 1, wherein the pixel region further includes a reset transistor between a power supply voltage and the first DCG transistor, wherein the reset transistor is configured to reset a voltage of the floating diffusion region to the power supply voltage in response to a pixel reset signal.

14. The imaging device according to claim 13, wherein the pixel region further includes a driver transistor having a source electrode connected to the power supply voltage, and a gate electrode connected to the floating diffusion region, and a selection transistor disposed between the driver transistor and an output signal line, wherein the driver transistor is configured to amplify changes in an electrical potential of the floating diffusion region that receives the photocharges accumulated in the photoelectric conversion device and transmits the photocharges to the selection transistor, and the selection transistor is turned on by a row selection signal and outputs an electrical signal transferred from the driver transistor as the pixel signal through the output signal line.

15. The imaging device according to claim 14, further comprising a transfer transistor disposed between the photoelectric conversion device and the floating diffusion region, wherein the transfer transistor is configured to transfer the photocharges accumulated in the photoelectric conversion device to the floating diffusion region in response to a transfer signal.

16. An imaging device comprising:

a first metal layer including a floating diffusion electrode of a floating diffusion region that accumulates photocharges generated by a photoelectric conversion element configured to generate the photocharges in response to an incident light, a gate electrode of a dual conversion gain DCG transistor that provides an additional capacitance to the floating diffusion region, and a first electrode of a first DCG capacitor connected to a source electrode of the DCG transistor and surrounding the floating diffusion electrode;

a second metal layer arranged on the first metal layer and including a dual conversion line for supplying a DCG gate signal, and a second electrode of the first DCG capacitor overlapping the first electrode;

a first insulating layer disposed between a first DCG gate electrode and the dual conversion line; and a second insulating layer disposed between the first electrode and the second electrode, wherein the second insulating layer has a permittivity that is higher than a permittivity of the first insulating layer.

17. The imaging device according to claim 16, wherein the first electrode includes a first electrode region extended along a first direction, a second electrode region connected to the first electrode region and extended along a second direction intersecting the first direction, a third electrode region connected to the second electrode region and extended along the first direction, and a fourth electrode region connected to the third electrode region and extended along the second direction, wherein the second electrode overlaps the first electrode region and the third electrode region.

18. The imaging device according to claim 17, wherein the first electrode region and the fourth electrode region are spaced apart from each other.

19. The imaging device according to claim 17, wherein the second electrode overlaps the first electrode region to the fourth electrode region.

20. The imaging device according to claim 19, further comprising a third metal layer on the second metal layer, wherein the dual conversion line includes a first dual conversion line arranged on the second metal layer and extended along the first direction, and a second dual conversion line arranged on the third metal layer, electrically connected to the first dual conversion line, and extended along the second direction.

\* \* \* \* \*